United States Patent
Kamata

(10) Patent No.: US 9,819,256 B2
(45) Date of Patent: Nov. 14, 2017

(54) SEMICONDUCTOR DEVICE

(71) Applicant: Semiconductor Energy Laboratory Co., Ltd., Atsugi-shi, Kanagawa-ken (JP)

(72) Inventor: Koichiro Kamata, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 40 days.

(21) Appl. No.: 14/632,104

(22) Filed: Feb. 26, 2015

(65) Prior Publication Data

US 2015/0171739 A1 Jun. 18, 2015

Related U.S. Application Data

(63) Continuation of application No. 14/456,275, filed on Aug. 11, 2014, now Pat. No. 8,981,518, which is a
(Continued)

(30) Foreign Application Priority Data

Jan. 29, 2010 (JP) ................................ 2010-019183

(51) Int. Cl.
*H02J 17/00* (2006.01)
*H02M 1/32* (2007.01)
(Continued)

(52) U.S. Cl.
CPC .......... *H02M 1/32* (2013.01); *G06K 19/0701* (2013.01); *G06K 19/0715* (2013.01);
(Continued)

(58) Field of Classification Search
CPC ........................ G06K 19/0715; H01L 27/1225
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1607764 A 12/2005
EP 1737044 A 12/2006
(Continued)

OTHER PUBLICATIONS

Taiwanese Office Action (Application No. 100102856) dated Mar. 30, 2016.
(Continued)

*Primary Examiner* — Raj R Gupta
(74) *Attorney, Agent, or Firm* — Robinson Intellectual Property Law Office; Eric J. Robinson

(57) ABSTRACT

To prevent damage on an element even when a voltage high enough to break the element is input. A semiconductor device of the invention operates with a first voltage and includes a protection circuit which changes the value of the first voltage when the absolute value of the first voltage is higher than a reference value. The protection circuit includes: a control signal generation circuit generating a second voltage based on the first voltage and outputting the generated second voltage; and a voltage control circuit. The voltage control circuit includes a transistor which has a source, a drain, and a gate, and which is turned on or off depending on the second voltage input to the gate and thus controls whether the value of the first voltage is changed based on the amount of current flowing between the source and the drain. The transistor also includes an oxide semiconductor layer.

40 Claims, 13 Drawing Sheets

Related U.S. Application Data continuation of application No. 13/012,160, filed on Jan. 24, 2011, now Pat. No. 8,816,469.

(51) Int. Cl.
  *H02M 7/217* (2006.01)
  *G06K 19/07* (2006.01)
  *G06K 19/077* (2006.01)
  *H01L 27/02* (2006.01)
  *H01L 27/12* (2006.01)
  *H02H 9/04* (2006.01)

(52) U.S. Cl.
  CPC .... *G06K 19/07749* (2013.01); *H01L 27/0248* (2013.01); *H01L 27/0285* (2013.01); *H01L 27/1225* (2013.01); *H02H 9/046* (2013.01); *H02J 17/00* (2013.01); *H02M 7/217* (2013.01)

(56) References Cited

U.S. PATENT DOCUMENTS

| | | | |
|---|---|---|---|
| 5,945,920 | A | 8/1999 | Maletsky |
| 6,294,274 | B1 | 9/2001 | Kawazoe et al. |
| 6,563,174 | B2 | 5/2003 | Kawasaki et al. |
| 6,573,172 | B1 | 6/2003 | En et al. |
| 6,727,522 | B1 | 4/2004 | Kawasaki et al. |
| 6,778,070 | B1 | 8/2004 | Thomas |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,274,543 | B2 | 9/2007 | Nishikawa et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,413,939 | B2 | 8/2008 | Hsu et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,511,343 | B2 | 3/2009 | Li et al. |
| 7,674,650 | B2 | 3/2010 | Akimoto et al. |
| 7,703,677 | B2 | 4/2010 | Alihodzic |
| 7,732,819 | B2 | 6/2010 | Akimoto et al. |
| 7,767,106 | B2 | 8/2010 | Chang |
| 7,893,495 | B2 | 2/2011 | Li et al. |
| 7,907,902 | B2 | 3/2011 | Kato et al. |
| 7,982,250 | B2 | 7/2011 | Yamazaki et al. |
| 8,084,331 | B2 | 12/2011 | Ofuji et al. |
| 8,181,882 | B2 | 5/2012 | Hata et al. |
| 8,233,252 | B2 | 7/2012 | Grombach et al. |
| 8,333,913 | B2 | 12/2012 | Inoue et al. |
| 8,358,202 | B2 | 1/2013 | Takahashi |
| 8,668,849 | B2 | 3/2014 | Inoue et al. |
| 8,977,203 | B2 | 3/2015 | Kato et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0041275 | A1 | 2/2003 | Nishio et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0057866 | A1 | 3/2005 | Mergens et al. |
| 2005/0199959 | A1 | 9/2005 | Chiang et al. |
| 2005/0205679 | A1* | 9/2005 | Alihodzic .......... G06K 19/0701 235/492 |
| 2005/0280509 | A1 | 12/2005 | Tanaka et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1* | 2/2008 | Chang .............. H01L 31/022466 438/722 |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0094180 | A1 | 4/2008 | Kato et al. |
| 2008/0099803 | A1* | 5/2008 | Li .......................... B82Y 10/00 257/291 |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0150475 | A1 | 6/2008 | Kato et al. |
| 2008/0166834 | A1 | 7/2008 | Kim et al. |
| 2008/0174408 | A1 | 7/2008 | Takahashi |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0078970 | A1* | 3/2009 | Yamazaki ........... H01L 21/8221 257/255 |
| 2009/0108913 | A1 | 4/2009 | Fort |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0186437 | A1 | 7/2009 | Akimoto |
| 2009/0186445 | A1 | 7/2009 | Akimoto |
| 2009/0189155 | A1 | 7/2009 | Akimoto |
| 2009/0189156 | A1 | 7/2009 | Akimoto |
| 2009/0273454 | A1 | 11/2009 | Onozuka et al. |
| 2009/0278122 | A1 | 11/2009 | Hosono et al. |
| 2009/0280600 | A1 | 11/2009 | Hosono et al. |
| 2009/0283812 | A1 | 11/2009 | Asami |
| 2009/0289341 | A1* | 11/2009 | Yamazaki ........ G06K 19/07735 257/679 |
| 2010/0003783 | A1 | 1/2010 | Akimoto |
| 2010/0038639 | A1 | 2/2010 | Akimoto |

(56) References Cited

U.S. PATENT DOCUMENTS

| | | |
|---|---|---|
| 2010/0072285 A1 | 3/2010 | Nishijima |
| 2010/0079203 A1 | 4/2010 | Furutani |
| 2010/0084467 A1 | 4/2010 | Nishido |
| 2010/0092800 A1 | 4/2010 | Itagaki et al. |
| 2010/0109002 A1 | 5/2010 | Itagaki et al. |
| 2011/0163613 A1 | 7/2011 | Kato et al. |
| 2015/0188311 A1 | 7/2015 | Kato et al. |

FOREIGN PATENT DOCUMENTS

| | | |
|---|---|---|
| EP | 1914669 A | 4/2008 |
| EP | 1921681 A | 5/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-004189 A | 1/2000 |
| JP | 2000-044236 A | 2/2000 |
| JP | 2000-150900 A | 5/2000 |
| JP | 2001-504625 | 4/2001 |
| JP | 2002-076356 A | 3/2002 |
| JP | 2002-289859 A | 10/2002 |
| JP | 2003-060060 A | 2/2003 |
| JP | 2003-085506 A | 3/2003 |
| JP | 2003-086000 A | 3/2003 |
| JP | 2003-086808 A | 3/2003 |
| JP | 2003-303890 A | 10/2003 |
| JP | 2003-319574 A | 11/2003 |
| JP | 2004-103957 A | 4/2004 |
| JP | 2004-273614 A | 9/2004 |
| JP | 2004-273732 A | 9/2004 |
| JP | 2005-267643 A | 9/2005 |
| JP | 2006-005651 A | 1/2006 |
| JP | 2006-261679 A | 9/2006 |
| JP | 2006-344941 A | 12/2006 |
| JP | 2008-042067 A | 2/2008 |
| JP | 2008-098637 A | 4/2008 |
| JP | 2008-123502 A | 5/2008 |
| JP | 2008-181499 A | 8/2008 |
| JP | 2006-227003 A | 9/2008 |
| JP | 2008-218786 A | 9/2008 |
| JP | 2009-135350 A | 6/2009 |
| JP | 2009-152633 A | 7/2009 |
| JP | 2009-212443 A | 9/2009 |
| JP | 2009-267410 A | 11/2009 |
| JP | 2009-272697 A | 11/2009 |
| JP | 2010-003295 A | 1/2010 |
| JP | 2010-003910 A | 1/2010 |
| TW | 200830557 | 7/2008 |
| TW | 200834429 | 8/2008 |
| TW | 200937613 | 9/2009 |
| WO | WO-99/30401 | 6/1999 |
| WO | WO-2004/114391 | 12/2004 |
| WO | WO-2007/058329 | 5/2007 |
| WO | WO-2008/114588 | 9/2008 |
| WO | WO-2009/110623 | 9/2009 |
| WO | WO-2009/142309 | 11/2009 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn]at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "Rfcpus on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 SID International Symposium Digest of Technical Papers, 2007, vol. 38, pp. 1673-1676.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janottla et al., "Oxygen Vacancies in ZnO", Appl. Phys. Lett (Applied Physics Letters), 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

(56) References Cited

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

International Search Report (Application No. PCT/JP2011/050598) dated Mar. 1, 2011.

Written Opinion (Application No. PCT/JP2011/050598) dated Mar. 1, 2011.

Taiwanese Office Action (Application No. 100102856) dated Nov. 26, 2015.

Korean Office Action (Application No. 2012-7021893) dated May 23, 2017.

* cited by examiner

800

801

802

803

SEMICONDUCTOR DEVICE

TECHNICAL FIELD

One embodiment of the present invention relates to a semiconductor device.

BACKGROUND ART

In recent years, semiconductor devices have been developed which are capable of supplying (also referred to as feeding) power (also referred to as a power supply voltage) through wireless communication, and further capable of transmitting and receiving data (also referred to as data communication) through wireless communication. For example, if a feeding function through wireless communication can be added to a portable information medium (e.g., a cellular phone) which is an example of the semiconductor devices, the portable information medium does not need to be connected to an external power feeding portion and can be fed more easily, for example, in any environment.

An individual identification technology utilizing an RFID (radio frequency identification) tag is known as an example of semiconductor devices capable of data transmission, data reception, data storing, data erasing and the like through wireless communication. The RFID tag is also referred to as an RF tag, a wireless tag, an electronic tag, or a wireless chip. The RFID tag is also referred to as an IC tag, an IC chip, or an IC card because it includes a functional circuit such as an integrated circuit (IC) for executing authentication or other processing. Data communication with the semiconductor device is performed by using a wireless communication device (such as a reader/writer, which is capable of transmitting and receiving a data signal through wireless communication). The individual identification technology using the semiconductor device is used for the production, management, or the like of an individual object and has been expected to be applied to personal authentication.

In general, the semiconductor device does not include in itself a power generating means and is fed through wireless communication; thus, the semiconductor device can be fed even at a distance from a feeding means. The distance over which wireless communication is possible is also referred to as a communication distance. In a semiconductor device externally supplied with power, the feeding efficiency generally tends to decrease as the communication distance increases. Therefore, semiconductor devices to which a desired amount of power can be supplied even at a long communication distance have been researched and developed (see Patent Document 1).

REFERENCE

Patent Document

[Patent Document 1] Japanese Published Patent Application No. 2006-005651

DISCLOSURE OF INVENTION

In the case of a semiconductor device capable of wireless communication over a predetermined distance or longer, however, when the semiconductor device is fed at a distance shorter than the predetermined distance, a voltage (also referred to as an overvoltage) high enough to break an element is input to the semiconductor device in some cases.

An object of one embodiment of the present invention is to prevent damage on an element even when a voltage high enough to break the element is input through wireless communication.

One embodiment of the present invention includes a protection circuit against voltage, so that when a voltage high enough to break an element is input, the voltage applied to the element is reduced by using the protection circuit to prevent damage on the element.

One embodiment of the present invention is a semiconductor device operating with a first voltage and including a protection circuit which changes the value of the first voltage when the absolute value of the first voltage is higher than a reference value. The protection circuit includes: a control signal generation circuit which generates a second voltage in accordance with the first voltage and outputs the generated second voltage; and a voltage control circuit. The voltage control circuit includes a transistor which has a source, a drain, and a gate, and which is turned on or off depending on the second voltage input as a control signal to the gate and thus controls whether the value of the first voltage is changed in accordance with the amount of current flowing between the source and the drain. The transistor also includes an oxide semiconductor layer serving as a channel formation layer. The band gap of the oxide semiconductor layer is equal to or more than 2 eV.

One embodiment of the present invention is a semiconductor device including: a rectifier circuit to which a first voltage is input, and which rectifies the first voltage to generate a second voltage and outputs the generated second voltage; and a protection circuit which has a control signal generation circuit and a voltage control circuit. The control signal generation circuit includes a divider circuit which divides the second voltage to generate a third voltage with use of the divided voltage and outputs the generated third voltage. The voltage control circuit includes a transistor which has a source, a drain, and a gate, and which is turned on or off depending on the third voltage input as a control signal to the gate and thus controls whether the value of the first voltage is changed in accordance with the amount of current flowing between the source and the drain. The transistor also includes an oxide semiconductor layer serving as a channel formation layer. The band gap of the oxide semiconductor layer is equal to or more than 2 eV.

One embodiment of the present invention is a semiconductor device including: an antenna circuit which receives a carrier wave to generate a first voltage and outputs the generated first voltage; a rectifier circuit to which the first voltage is input, and which rectifies the first voltage to generate a second voltage and outputs the generated second voltage; a protection circuit; and a power supply voltage generation circuit which generates a power supply voltage in accordance with the second voltage. The protection circuit includes a control signal generation circuit and a voltage control circuit. The control signal generation circuit includes a divider circuit which divides the second voltage to generate a third voltage with use of the divided voltage and outputs the generated third voltage. The voltage control circuit includes a transistor which has a source, a drain, and a gate, and which is turned on or off depending on the third voltage input as a control signal to the gate and thus controls whether the value of the first voltage is changed in accordance with the amount of current flowing between the source and the drain. The transistor also includes an oxide semiconductor layer serving as a channel formation layer. The band gap of the oxide semiconductor layer is equal to or more than 2 eV.

One embodiment of the present invention is a semiconductor device including: an antenna circuit which receives a carrier wave to generate a first voltage and outputs the generated first voltage; a rectifier circuit to which the first voltage is input, and which rectifies the first voltage to generate a second voltage and outputs the generated second voltage; a protection circuit; a power supply voltage generation circuit which generates a power supply voltage in accordance with the second voltage; a demodulation circuit which demodulates the received carrier wave to extract a data signal; a functional circuit to which the data signal and the power supply voltage are input, and which carries out processing based on the data signal; and a modulation circuit which modulates a carrier wave to be transmitted in accordance with a response signal input from the functional circuit. The protection circuit includes a control signal generation circuit and a voltage control circuit. The control signal generation circuit includes a divider circuit which divides the second voltage to generate a third voltage with use of the divided voltage and outputs the generated third voltage. The voltage control circuit includes a transistor which has a source, a drain, and a gate, and which is turned on or off depending on the third voltage input as a control signal to the gate and thus controls whether the value of the first voltage is changed in accordance with the amount of current flowing between the source and the drain. The transistor also includes an oxide semiconductor layer serving as a channel formation layer. The band gap of the oxide semiconductor layer is equal to or more than 2 eV.

Note that in this specification, terms with ordinal numbers, such as "first" and "second", are used in order to avoid confusion among components, and the terms do not limit the components numerically.

According to one embodiment of the present invention, damage on an element can be prevented even in the case where a voltage high enough to break the element is input.

BEST MODE FOR CARRYING OUT THE INVENTION

Hereinafter, embodiments of the present invention will be described with reference to the drawings. Note that the present invention is not limited to the following description, and it will be easily understood by those skilled in the art that various changes and modifications can be made without departing from the spirit and scope of the present invention. Thus, the present invention should not be interpreted as being limited to the following description of the embodiments.

Embodiment 1

In this embodiment, a semiconductor device including a protection circuit will be described.

Figure 1:
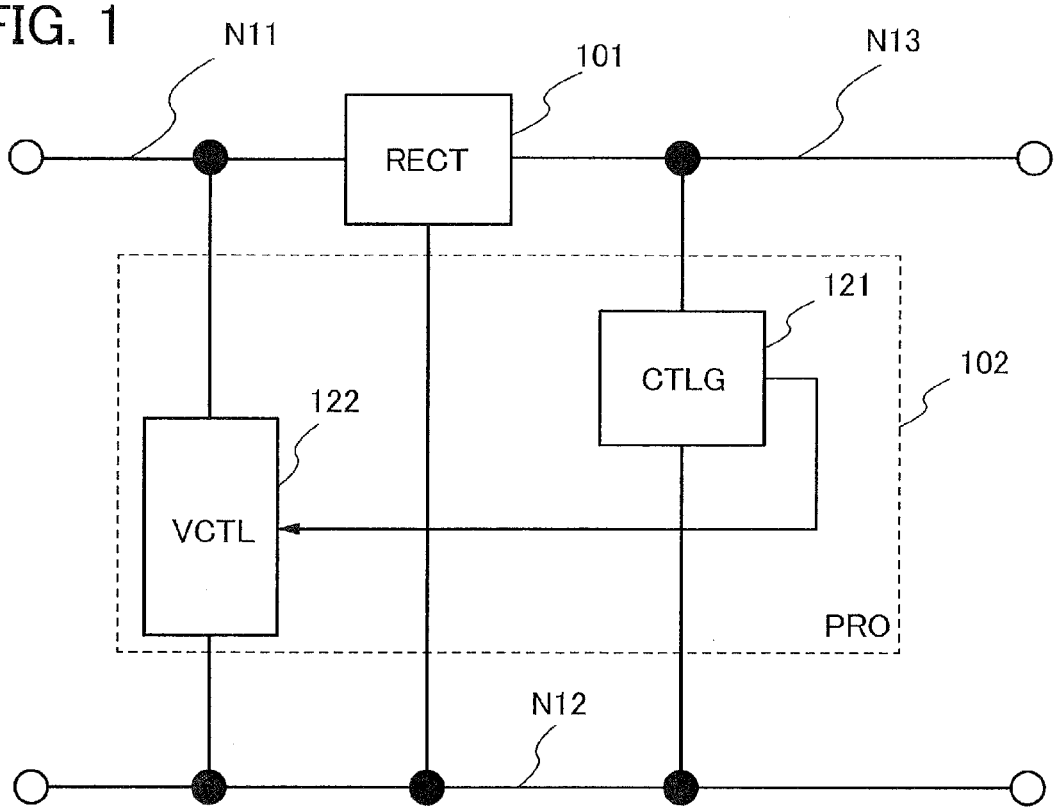
FIG. 1 is a block diagram illustrating an example of a configuration of a semiconductor device in Embodiment 1.

First, an example of a configuration of the semiconductor device in this embodiment will be described with reference to FIG. 1. FIG. 1 is a block diagram illustrating an example of the configuration of the semiconductor device in this embodiment.

The semiconductor device illustrated in FIG. 1 includes a rectifier circuit (also referred to as a RECT) 101 for rectifying an input voltage, and a protection circuit (also referred to as a PRO) 102 for controlling the value of the input voltage.

A voltage V21 is input to the rectifier circuit 101. The rectifier circuit 101 has a function of rectifying the input voltage V21 to generate a voltage V22, and outputting the generated voltage V22.

The rectifier circuit 101 includes, for example, a rectifier element. A full-wave rectifier circuit or a half-wave rectifier circuit can be used as the rectifier circuit 101, for example. Further, an N-fold voltage rectifier circuit (N is a natural number of two or more) can also be used as the rectifier circuit 101. Note that the rectifier circuit 101 is not necessarily provided in the semiconductor device in this embodiment; for example, it does not need to be provided in the case where the voltage V21 is a direct-current voltage. In the case where the rectifier circuit 101 is not provided, the semiconductor device operates with the voltage V21.

Note that the voltage V21 is a voltage input through a node N11 and a node N12, and the voltage V22 is a voltage output through a node N13 and a node N12. The node N11, the node N12, and the node N13 are points connected to other elements.

Note that in general, voltage refers to a difference between potentials at two points (also referred to as a potential difference). However, values of a voltage and a potential are both represented by volt (V) in circuit diagrams and the like in some cases, so that it is difficult to distinguish between them. Thus, in this specification, a potential difference between a potential at one point and a potential to be the reference (also referred to as a reference potential) is referred to as a voltage at the point in some cases unless otherwise specified.

The protection circuit 102 has a function of, when the absolute value of the voltage V21 is higher than a value to be the reference (also referred to as a reference value), changing the value of the voltage V21 input to the rectifier circuit 101 in accordance with the voltage V22 rectified by the rectifier circuit 101. The reference value can be determined as appropriate depending on the circuit specification. When the absolute value of the voltage V21 is higher than the reference value, the value of the voltage V21 is preferably controlled in accordance with the voltage V22 so as to be equal to or lower than the reference value.

Further, an example of a circuit configuration of the protection circuit 102 will be described with reference to FIG. 1.

As illustrated in FIG. 1, the protection circuit 102 includes a control signal generation circuit (also referred to as a CTLG) 121 and a voltage control circuit (also referred to as a VCTL) 122.

The control signal generation circuit 121 has a function of generating, in accordance with the voltage V22, a voltage to be a control signal CTL31 of the voltage control circuit 122, and outputting the generated voltage.

The voltage output as the control signal CTL31 from the control signal generation circuit 121 is input to the voltage control circuit 122. The voltage control circuit 122 has a function of controlling whether the voltage V21 is changed in accordance with the input control signal CTL31.

Figure 2A:
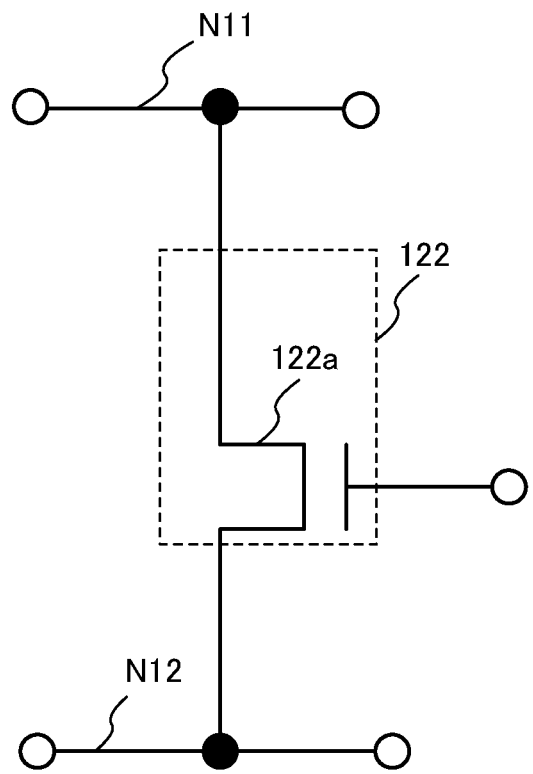
FIGS. 2A and 2B are circuit diagrams each illustrating an example of a configuration of a voltage control circuit in Embodiment 1.
Figure 2B:
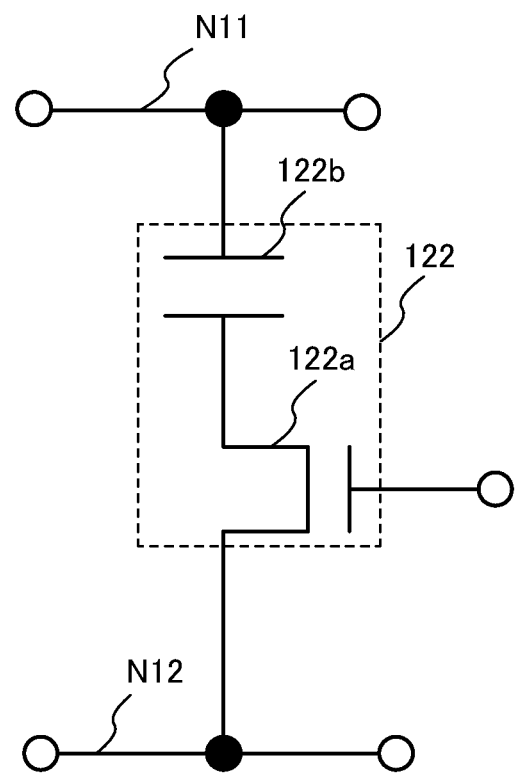

Configuration examples of the voltage control circuit 122 will be described with reference to FIGS. 2A and 2B. FIGS. 2A and 2B are circuit diagrams illustrating configuration examples of the voltage control circuit in this embodiment.

The voltage control circuit 122 illustrated in FIGS. 2A and 2B includes at least a transistor 122a.

Note that in this specification, a transistor is a field-effect transistor and includes at least a source, a drain, and a gate.

The source refers to the entire source electrode and source wiring, or part of them. In some cases, the source electrode is not distinguished from the source wiring and a conductive layer having the functions of both the source electrode and the source wiring is referred to as a source.

The drain refers to the entire drain electrode and drain wiring, or part of them. In some cases, the drain electrode is not distinguished from the drain wiring and a conductive layer having the functions of both the drain electrode and the drain wiring is referred to as a drain.

The gate refers to the entire gate electrode and gate wiring, or part of them. In some cases, the gate electrode is not distinguished from the gate wiring and a conductive layer having the functions of both the gate electrode and the gate wiring is referred to as a gate.

Further, the source and drain of a transistor are switched depending on the structure, operation conditions, and the like of the transistor; thus, it is difficult to distinguish between the source and the drain. Therefore, in this document (such as the specification, claims, and drawings), one of the source and the drain of a transistor is referred to as a first terminal and the other is referred to as a second terminal in some cases. In the case where the source or the drain is referred to as a first terminal or a second terminal, the gate is sometimes referred to as a third terminal.

The control signal CTL31 is input to a gate of the transistor 122a and the transistor 122a is turned on or off depending on the voltage of the input control signal CTL31. The voltage control circuit 122 illustrated in FIGS. 2A and 2B has a function of controlling whether the voltage V21 is changed in accordance with the amount of current flowing between a source and a drain of the transistor 122a.

In the voltage control circuit 122 illustrated in FIG. 2A, a first terminal of the transistor 122a is electrically connected to the node N11 and a second terminal of the transistor 122a is electrically connected to the node N12.

The voltage control circuit 122 illustrated in FIG. 2B includes a capacitor 122b.

Note that in this specification, a capacitor includes a first terminal and a second terminal, and includes a first electrode serving as part or the whole of the first terminal, a second electrode serving as part or the whole of the second terminal, and a dielectric layer in which electric charge is accumulated when voltage is applied between the first electrode and the second electrode.

A first terminal of the capacitor 122b is electrically connected to the node N11. The capacitor 122b allows reducing the voltage applied between the source and the drain of the transistor 122a. A resistor may be provided instead of the capacitor 122b.

Note that in this specification, a resistor includes a first terminal and a second terminal.

In the voltage control circuit 122 illustrated in FIG. 2B, the first terminal of the transistor 122a is electrically connected to the second terminal of the capacitor 122b and the second terminal of the transistor 122a is electrically connected to the node N12.

Next, a structure of the transistor which can be used as the transistor 122a will be described below.

As the transistor 122a, a transistor including an oxide semiconductor layer which serves as a channel formation layer can be used for example. The oxide semiconductor layer of the transistor, which has a function of the channel formation layer, is highly purified to be an intrinsic (also referred to as an I-type) or substantially intrinsic semiconductor layer.

Note that the high purification means at least one of the following concepts: removal of hydrogen from an oxide semiconductor layer as much as possible; and reduction of defects, which are caused by oxygen deficiency in an oxide semiconductor layer, by supply of oxygen to the oxide semiconductor layer.

As an oxide semiconductor which can be used for the oxide semiconductor layer, for example, a four-component metal oxide, a three-component metal oxide, or a two-component metal oxide can be given. As the four-component metal oxide, for example, an In—Sn—Ga—Zn—O-based metal oxide can be used. As the three-component metal oxide, for example, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide can be used. As the two-component metal oxide, for example, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Sn—O-based metal oxide can be used. In addition, an In—O-based metal oxide, a Sn—O-based metal oxide, a Zn—O-based metal oxide, or the like can also be used as the oxide semiconductor. The metal oxide that can be used as the oxide semiconductor may contain $SiO_2$.

Moreover, a material represented by $InMO_3(ZnO)_m$ (m>0) can be used as the oxide semiconductor. Here, M denotes one or more of metal elements selected from Ga, Al, Mn, and Co. For example, M can be Ga, Ga and Al, Ga and Mn, or Ga and Co. For example, an oxide semiconductor whose composition formula is represented by $InMO_3(ZnO)_m$ where M is Ga is referred to as the In—Ga—Zn—O-based oxide semiconductor described above, Furthermore, the band gap of the oxide semiconductor layer is equal to or more than 2 eV, preferably equal to or more than 2.5 eV, and more preferably equal to or more than 3 eV, which reduces the number of carriers generated by thermal excitation to a negligible level. In addition, the amount of impurity such as hydrogen which might serve as a donor is reduced to a certain amount or less so that the carrier concentration is less than $1 \times 10^{14}/cm^3$, preferably equal to or less than $1 \times 10^{12}/cm^3$. That is, the carrier concentration of the oxide semiconductor layer is reduced to zero or substantially zero.

In the aforementioned oxide semiconductor layer, the avalanche breakdown does not easily occur and the withstand voltage is high. For example, the band gap of silicon is as narrow as 1.12 eV; thus, electrons are easily generated due the avalanche breakdown, and the number of electrons which are accelerated to high speed so as to go over an energy barrier to a gate insulating layer is increased. In contrast, since the oxide semiconductor used for the aforementioned oxide semiconductor layer has a band gap of 2 eV or more which is wider than that of silicon, the avalanche breakdown does not easily occur and resistance to hot-carrier degradation is higher than that of silicon, and the withstand voltage is thus high.

The hot-carrier degradation means, for example, deterioration of transistor characteristics caused by fixed charge which is generated when highly-accelerated electrons are injected into a gate insulating layer in the vicinity of a drain in a channel; or deterioration of transistor characteristics caused by a trap level which is formed at the interface of a gate insulating layer by highly-accelerated electrons. The deterioration of transistor characteristics is, for example, variations in threshold voltage or gate leakage. The hot-carrier degradation is caused by channel-hot-electron injection (also referred to as CHE injection) or drain-avalanche-hot-carrier injection (also referred to as DAHC injection).

Note that the band gap of silicon carbide, which is one of materials having high withstand voltage, is substantially equal to that of an oxide semiconductor used for the oxide semiconductor layer, but electrons are less likely to be accelerated in an oxide semiconductor because the mobility of the oxide semiconductor is lower than that of silicon carbide by approximately two orders of magnitude. Further, an energy barrier between an oxide semiconductor and a gate insulating layer is larger than a barrier between silicon carbide, gallium nitride, or silicon and a gate insulating layer; therefore, the number of electrons injected into the gate insulating layer is extremely small, whereby hot-carrier degradation is less likely to be caused and withstand voltage is higher than in the case of silicon carbide, gallium nitride, or silicon. The oxide semiconductor has a high withstand voltage even in an amorphous state.

Furthermore, the transistor including the oxide semiconductor layer can have an off-current per micrometer of channel width of 10 aA/μm ($1 \times 10^{-17}$ A/μm) or less, 1 aA/μm ($1 \times 10^{-18}$ A/μm) or less, 10 zA/μm ($1 \times 10^{-20}$ A/μm) or less, and further 1 zA/μm ($1 \times 10^{-21}$ A/μm) or less.

As illustrated in FIGS. 2A and 2B, an example of the voltage control circuit in this embodiment includes at least a transistor. A control signal is input to a gate of the transistor from a control signal generation circuit and the transistor is turned on depending on the input control signal, whereby the value of a voltage (the voltage V21) input to the semiconductor device in this embodiment is changed in accordance with the amount of current flowing between a source and a drain of the transistor.

In addition, the transistor includes an oxide semiconductor layer which uses an oxide semiconductor having a higher withstand voltage than, for example, silicon used for a conventional transistor. Damage on a protection circuit can be prevented by using the transistor for the semiconductor device in this embodiment, resulting in an increase in reliability.

Next, an example of the operation of the semiconductor device illustrated in FIG. 1 will be described.

First, the voltage V21 is input to the rectifier circuit 101 through the node N11 and the node N12.

In the rectifier circuit 101, the input voltage V21 is rectified so that the voltage V22 is generated, and then, the generated voltage V22 is output as an output voltage through the node N13 and the node N12.

In the protection circuit 102, the control signal generation circuit 121 generates a voltage based on the value of the voltage V22, and the generated voltage is output as a control signal CTL31 to the gate of the transistor 122a in the voltage control circuit 122.

At this time, the transistor 122a is turned off when the absolute value of the voltage V22 is equal to or lower than a reference value.

In the case where the absolute value of the voltage V22 is higher than the reference value, the transistor 122a is turned on and electrical conduction is established between the source and the drain of the transistor 122a, so that a current flows between the source and the drain of the transistor 122a and the value of the voltage V21 is changed accordingly. The amount of change of the voltage V21 is determined in accordance with the amount of current flowing between the source and the drain of the transistor 122a. In other words, the amount of change of the voltage V21 is determined depending on the value of the voltage V22.

As described above, the example of the semiconductor device shown in this embodiment includes a protection circuit against voltage, so that when the absolute value of an output voltage is higher than the reference value, the value of an input voltage is changed in accordance with the output voltage by using the protection circuit. As a result, damage on an element can be prevented even in the case where, for example, the value of the input voltage is so high at a certain time that the element is broken. In addition, when the absolute value of the output voltage is higher than the reference value, the input voltage can be controlled so that the output voltage is converged to a constant value.

In the example of the semiconductor device shown in this embodiment, the protection circuit includes a transistor for controlling a change in the value of an input voltage, and the transistor includes an oxide semiconductor layer which serves as a channel formation layer and has a wide band gap. Since the transistor has a higher withstand voltage than a conventional transistor and is less likely to be damaged, the reliability of the semiconductor device can be improved. Further, the transistor has a low off-current, which prevents a decrease in the input voltage of the semiconductor device due to the off-current of the transistor.

Embodiment 2

In this embodiment, an example of a configuration of the control signal generation circuit shown in the above Embodiment 1 will be described.

Figure 3A:
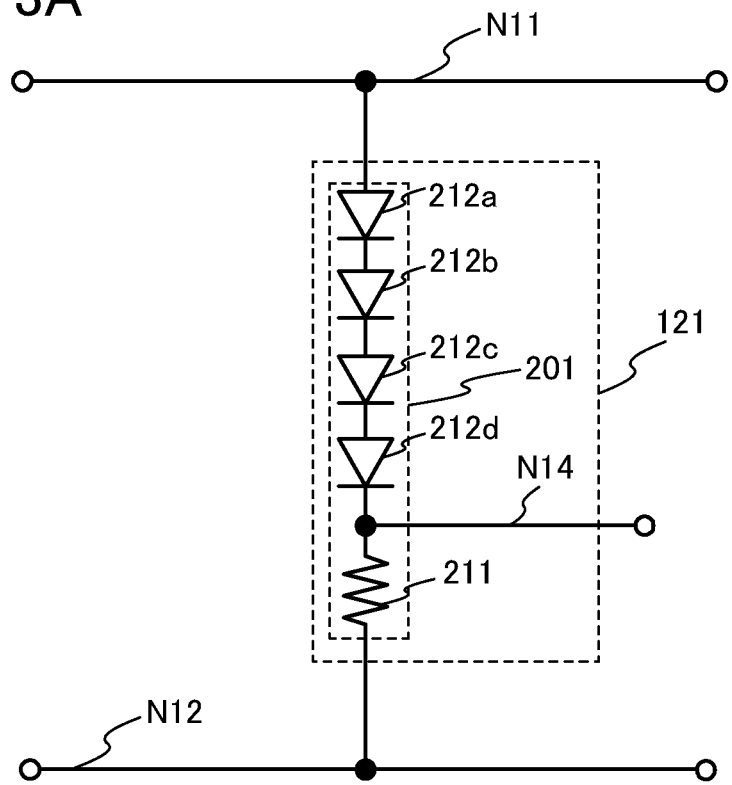
FIGS. 3A and 3B are circuit diagrams each illustrating an example of a configuration of a control signal generation circuit in Embodiment 2.
Figure 3B:
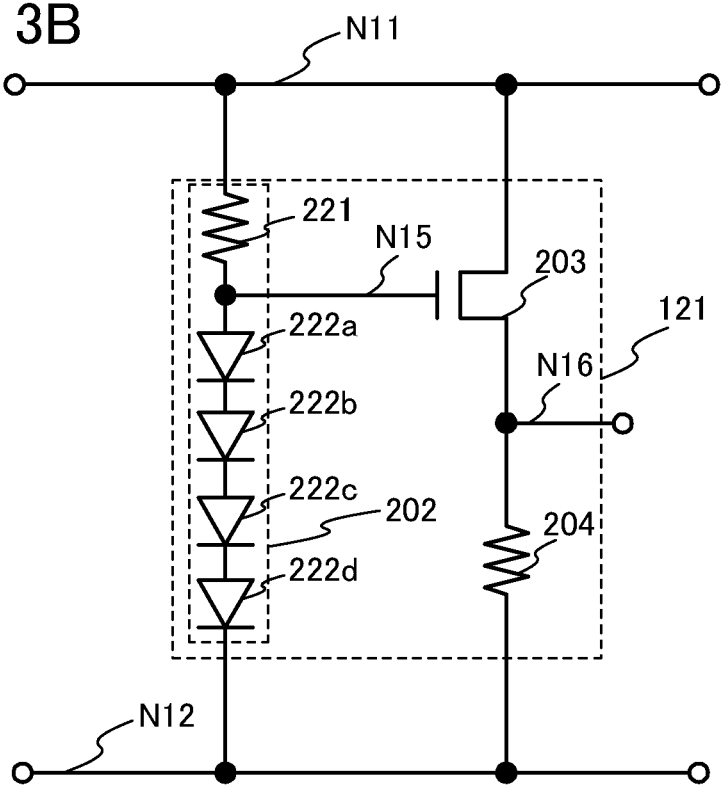

The example of the configuration of the control signal generation circuit in this embodiment will be described with reference to FIGS. 3A and 3B. FIGS. 3A and 3B are circuit diagrams illustrating examples of the configuration of the control signal generation circuit in this embodiment.

The control signal generation circuit 121 illustrated in FIG. 3A includes at least a divider circuit 201.

The divider circuit 201 has a function of dividing the voltage V22. An example of a configuration of the divider circuit 201 will be described below.

The divider circuit 201 includes a resistor 211, a rectifier element 212a, a rectifier element 212b, a rectifier element 212c, and a rectifier element 212d. Although the control signal generation circuit 121 illustrated in FIG. 3A includes the four rectifier elements, the present invention is not limited to this example; the control signal generation circuit of this embodiment can include one rectifier element, or K (K is a natural number of two or more) rectifier elements which are electrically connected in series to each other in a forward direction.

The rectifier elements 212a to 212d are electrically connected in series to each other in a forward direction.

As the rectifier elements 212a to 212d, for example, a PN diode, a PIN diode, or a diode-connected field-effect transistor can be used.

A first terminal of the resistor 211 is electrically connected to a cathode of the rectifier element 212d. Note that a point at which the resistor 211 and the rectifier element 212d are connected is also referred to as a node N14.

In the divider circuit 201, the voltage V22 is applied between an anode of the rectifier element 212a and a second terminal of the resistor 211.

Next, an example of the operation of the control signal generation circuit illustrated in FIG. 3A will be described.

First, the voltage V22 is divided by the divider circuit 201, whereby the voltage of the node N14 becomes equal to the divided voltage V22. Note that the value of the voltage of the node N14 is determined by the value of the voltage V21 and the value of the voltage V22.

For example, when the absolute value of the voltage V21 is equal to or lower than a reference value, any of the rectifier elements 212a to 212d is brought into a non-conduction state. At this time, the combined resistance of the rectifier elements 212a to 212d can be thought to be much higher than the resistance of the resistor 211; accordingly, the voltage of the node N14 is close to the potential of the node N12. Note that the reference value is determined as appropriate by controlling the threshold voltage of the rectifier elements 212a to 212d, the resistance of the resistor 211, or the like.

When the absolute value of the voltage V21 is higher than the reference value, the rectifier elements 212a to 212d are brought into a conduction state. At this time, the combined resistance of the rectifier elements 212a to 212d can be thought to be much lower than the resistance of the resistor 211; accordingly, the voltage of the node N14 increases. At this time, the voltage of the node N14 becomes equal to or higher than a value necessary for the transistor 122a illustrated in FIG. 2A or FIG. 2B to be turned on.

Further, the control signal generation circuit illustrated in FIG. 3A outputs the voltage of the node N14 as the control signal CTL31 to the gate of the transistor 122a illustrated in FIG. 2A or FIG. 2B. That is an example of the operation of the control signal generation circuit illustrated in FIG. 3A.

As illustrated in the example of FIG. 3A, the control signal generation circuit shown in Embodiment 1 can be formed by using at least a divider circuit to divide a voltage applied to the divider circuit, and generating a control signal of the voltage control circuit shown in Embodiment 1 with use of the divided voltage.

The control signal generation circuit illustrated in FIG. 3A can have a configuration in which all the transistors have the same conductivity type. Consequently, the number of steps can be reduced as compared to the case of using a plurality of transistors with different conductivity types, resulting in a reduction in manufacturing cost.

Note that the configuration of the control signal generation circuit of this embodiment is not limited to that illustrated in FIG. 3A, and can be other configurations. Another configuration of the control signal generation circuit of this embodiment will be described with reference to FIG. 3B.

The control signal generation circuit 121 illustrated in FIG. 3B includes a divider circuit 202, a transistor 203, and a resistor 204.

The divider circuit 202 has a function of dividing the voltage V22. An example of a configuration of the divider circuit 202 will be described below.

The divider circuit 202 includes a resistor 221, a rectifier element 222a, a rectifier element 222b, a rectifier element 222c, and a rectifier element 222d. Although the control signal generation circuit 121 illustrated in FIG. 3B includes the four rectifier elements, the present invention is not limited to this example; the control signal generation circuit of this embodiment can include one rectifier element, or K rectifier elements which are electrically connected in series to each other in a forward direction.

The rectifier elements 222a to 222d are electrically connected in series to each other in a forward direction. An anode of the rectifier element 222a is electrically connected to a second terminal of the resistor 221.

As the rectifier elements 222a to 222d, for example, a PN diode, a PIN diode, or a diode-connected field-effect transistor can be used.

In the divider circuit 202, the voltage V22 is applied between a first terminal of the resistor 221 and a cathode of the rectifier element 222d.

In the control signal generation circuit illustrated in FIG. 3B, the voltage V22 is applied between a first terminal of the transistor 203 and a second terminal of the resistor 204.

A gate of the transistor 203 is electrically connected to the second terminal of the resistor 221.

As the transistor 203, for example, a transistor including a single crystal semiconductor can be used.

A first terminal of the resistor 204 is electrically connected to a second terminal of the transistor 203. Note that a point at which the first terminal of the resistor 204 is connected to the second terminal of the transistor 203 is also referred to as a node N16.

Next, an example of the operation of the control signal generation circuit illustrated in FIG. 3B will be described. Note that as an example, a p-type transistor is used as the transistor 203.

First, the voltage V22 is divided by the divider circuit 202, whereby the voltage of a node N15 becomes equal to the divided voltage V22. Note that the voltage of the node N15 is determined by the value of the voltage V21 and the value of the voltage V22.

For example, when the absolute value of the voltage V21 is equal to or lower than a reference value, any of the rectifier elements 222a to 222d is brought into a non-conduction state. At this time, the combined resistance of the rectifier elements 222a to 222d can be thought to be much higher than the resistance of the resistor 221; accordingly, the voltage of the node N15 is close to the potential of the node N11. Note that the reference value is determined as appropriate by controlling the threshold voltage of the rectifier elements 222a to 222d, the resistance of the resistor 221, or the like.

When the absolute value of the voltage V22 is equal to or lower than the reference value, the transistor 203 is turned off. At this time, the voltage of the node N16 is substantially equal to the potential of the node N12.

When the absolute value of the voltage V22 is higher than the reference value, the rectifier elements 222a to 222d are brought into a conduction state. At this time, the combined resistance of the rectifier elements 222a to 222d can be thought to be much lower than the resistance of the resistor 221; accordingly, the voltage of the node N15 decreases to a value necessary for the transistor 203 to be turned on.

In addition, when the absolute value of the voltage V22 is higher than the reference value, the transistor 203 is turned on and the voltage of the node N16 increases. At this time, the voltage of the node N16 becomes equal to or higher than a value necessary for the transistor 122a illustrated in FIG. 2A or FIG. 2B to be turned on.

Further, the control signal generation circuit illustrated in FIG. 3B outputs the voltage of the node N16 as the control signal CTL31 to the gate of the transistor 122a illustrated in FIG. 2A or FIG. 2B. That is an example of the operation of the control signal generation circuit illustrated in FIG. 3B.

The control signal generation circuit illustrated in FIG. 3B includes the transistor and the resistor in addition to the configuration of the control signal generation circuit illustrated in FIG. 3A. The configuration including the transistor makes it possible to reduce the time for the voltage as the control signal CTL31 to change to a desired value.

Note that this embodiment can be combined with or replaced by any of the other embodiments, as appropriate.

Embodiment 3

In this embodiment, an example of the rectifier circuit shown in the above Embodiment 1 will be described.

Figure 4:
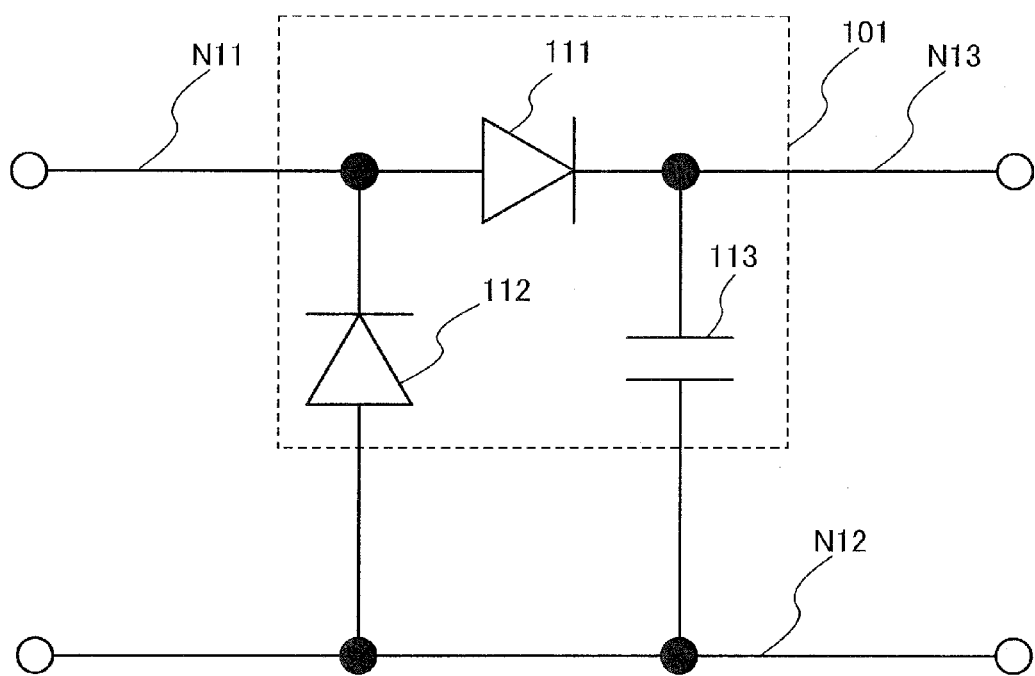
FIG. 4 is a circuit diagram illustrating an example of a configuration of a rectifier circuit in Embodiment 3.

First, the example of the configuration of the rectifier circuit in this embodiment will be described with reference to FIG. 4. FIG. 4 is a circuit diagram illustrating the example of the configuration of the rectifier circuit in this embodiment.

The rectifier circuit illustrated in FIG. 4 includes a rectifier element 111, a rectifier element 112, and a capacitor 113.

A cathode of the rectifier element 112 is electrically connected to an anode of the rectifier element 111.

A first terminal of the capacitor 113 is electrically connected to a cathode of the rectifier element 111.

In the rectifier circuit illustrated in FIG. 4, the voltage V21 is applied between the node N11 and the node N12, and the voltage V22 is applied between the node N13 and the node N12.

As the rectifier elements 111 and 112, for example, a PN diode, a PIN diode, or a diode-connected field-effect transistor can be used.

Next, an example of the operation of the rectifier circuit illustrated in FIG. 4 will be described.

When the voltage V21 is higher than a reference potential and the absolute value of a voltage applied to the rectifier element 111 in a forward direction is higher than the threshold voltage of the rectifier element 111, the rectifier element 111 is brought into a conduction state and the rectifier element 112 is brought into a non-conduction state. At this time, the voltage V21 is rectified by the rectifier element 111 and a charge corresponding to the potential of the node N11 is accumulated in the first terminal of the capacitor 113.

When the voltage V21 is lower than the reference potential and the absolute value of a voltage applied to the rectifier element 112 in a forward direction is higher than the threshold voltage of the rectifier element 112, the rectifier element 112 is brought into a conduction state and the rectifier element 111 is brought into a non-conduction state. At this time, the voltage V21 is rectified by the rectifier element 112 and a charge corresponding to the potential of the node N11 is accumulated in a second terminal of the capacitor 113. Consequently, a voltage applied to the capacitor 113 increases to about twice as high as the voltage V21. The increased voltage becomes the voltage V22.

As illustrated in the example of FIG. 4, a half-wave voltage doubler rectifier circuit can be used as the rectifier circuit in Embodiment 1. The rectifier circuit is not limited to this example; an N-fold voltage rectifier circuit can be used, and a full-wave rectifier circuit can also be used.

Note that this embodiment can be combined with or replaced by any of the other embodiments, as appropriate.

Embodiment 4

In this embodiment, a semiconductor device capable of generating a power supply voltage through wireless communication will be described as an example of the semiconductor devices shown in the above embodiments.

Figure 5:
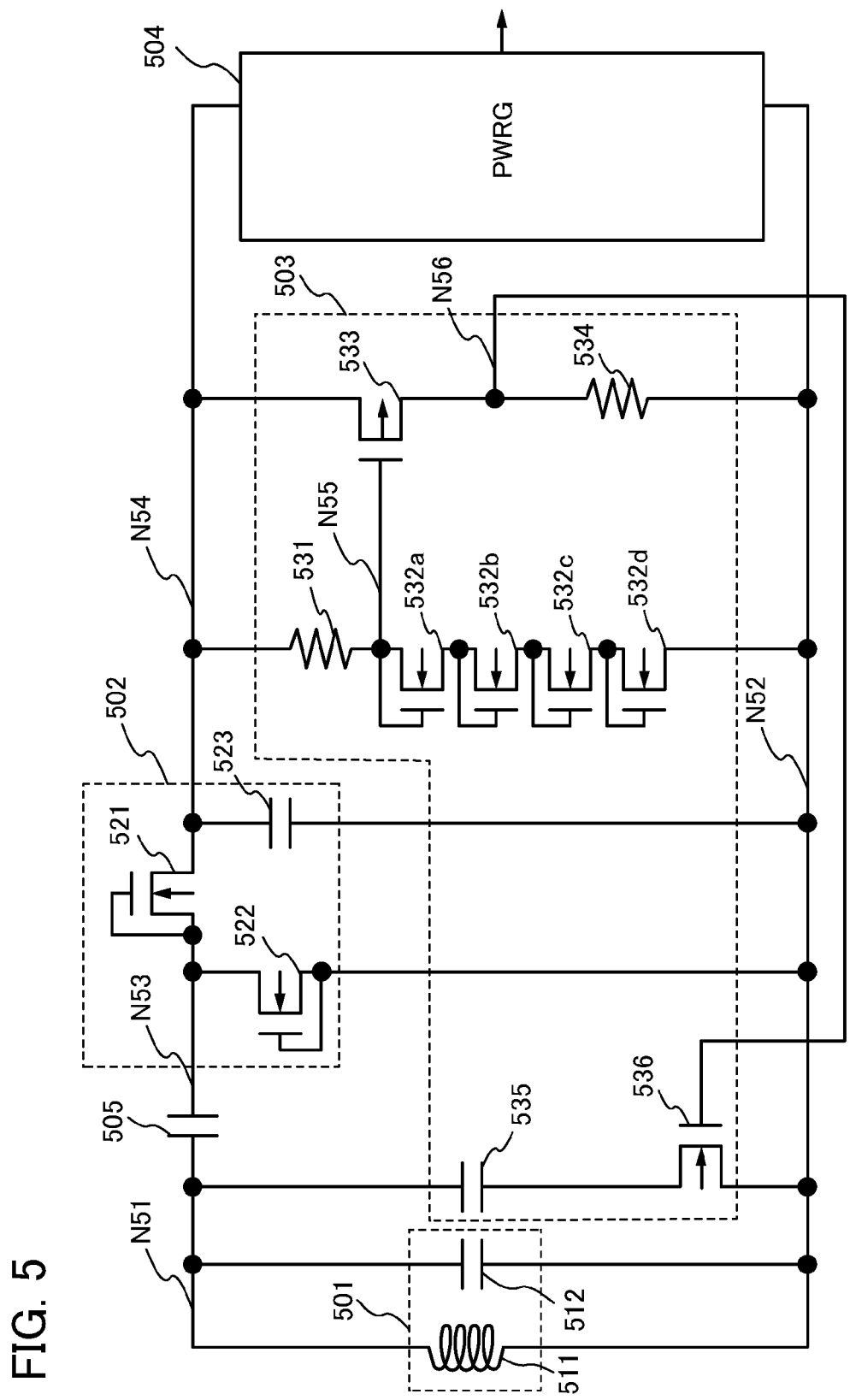
FIG. 5 is a diagram illustrating an example of a configuration of a semiconductor device in Embodiment 4.
Figure 6:
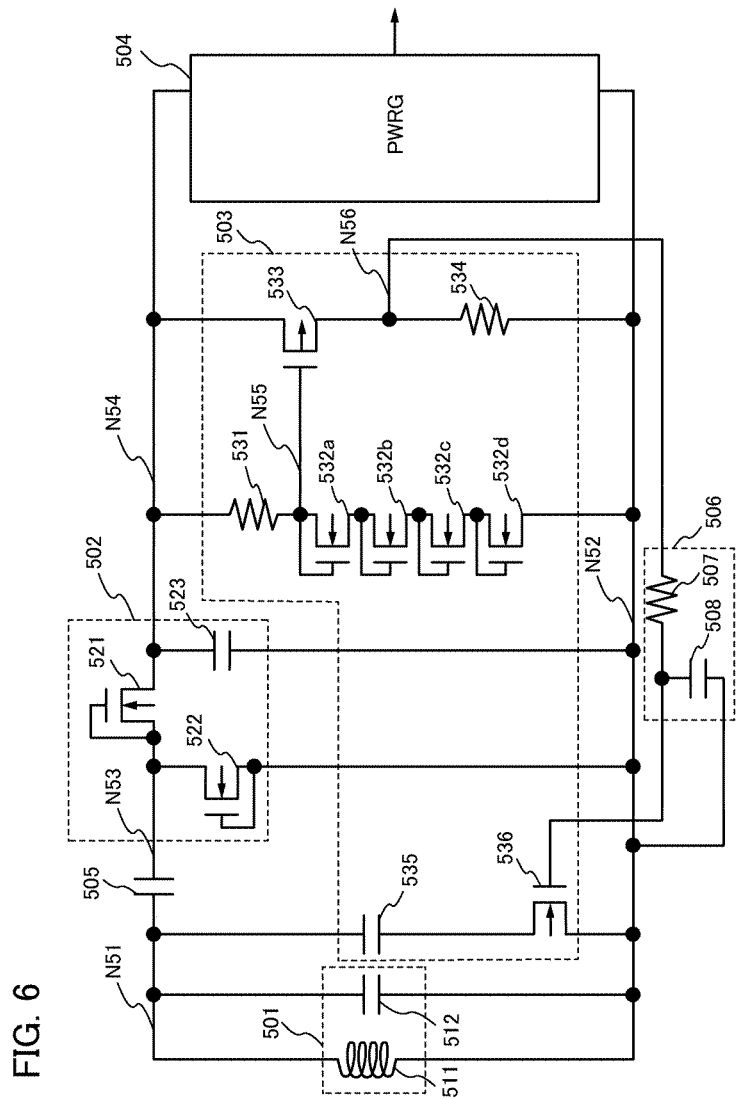
FIG. 6 is a diagram illustrating an example of a configuration of a semiconductor device in Embodiment 4.

First, an example of a configuration of the semiconductor device in this embodiment will be described with reference to FIG. 5 and FIG. 6. FIG. 5 and FIG. 6 are diagrams illustrating examples of the configuration of the semiconductor device in this embodiment.

The semiconductor device illustrated in FIG. 5 and FIG. 6 includes an antenna circuit 501 which transmits and receives a carrier wave, a rectifier circuit 502 which rectifies an input voltage, a protection circuit 503 which controls the value of the input voltage, and a power supply voltage generation circuit (also referred to as a PWRG) 504 which generates a power supply voltage Vp in accordance with the input voltage.

The antenna circuit 501 has a function of receiving a carrier wave, and includes an antenna 511 and a capacitor 512 as illustrated in FIG. 5 and FIG. 6.

The carrier wave is an alternate-current signal which is also referred to as a carrier. With the carrier wave, feeding or data signal communication is performed. Note that a carrier wave externally transmitted to the antenna circuit 501 includes a modulated carrier wave (a modulated wave).

The antenna 511 includes a first terminal and a second terminal.

The capacitor 512 has a function of a resonance capacitor. Although the capacitor 512 is not necessarily provided in the semiconductor device in this embodiment, the resonance frequency of the antenna circuit 501 can be controlled by using the capacitor 512.

In the semiconductor device illustrated in FIG. 5 and FIG. 6, a capacitor 505 is provided between the antenna circuit 501 and the rectifier circuit 502. A first terminal of the capacitor 505 is electrically connected to the first terminal of the antenna 511. The capacitor 505 has a function of a filter element which removes a DC component from an output voltage of the antenna circuit 501. Note that a point at which the first terminal of the capacitor 505 is connected to the first terminal of the antenna 511 is also referred to as a node N51.

The rectifier circuit 502 includes a transistor 521, a transistor 522, and a capacitor 523.

A first terminal of the transistor 521 is electrically connected to a second terminal of the capacitor 505, and a second terminal of the transistor 521 is electrically connected to the power supply voltage generation circuit 504. Since a gate of the transistor 521 is electrically connected to the first terminal of the transistor 521, the transistor 521 has a function of a rectifier element. Note that a point at which the first terminal of the transistor 521 is connected to the second terminal of the capacitor 505 is also referred to as a node N53.

A first terminal of the transistor 522 is electrically connected to the first terminal of the transistor 521, and a second terminal of the transistor 522 is electrically connected to the second terminal of the antenna 511. Since a gate of the transistor 522 is electrically connected to the second terminal of the transistor 522, the transistor 522 has a function of a rectifier element.

As the transistor 521 and the transistor 522, it is possible to use, for example, a transistor including an oxide semiconductor layer which can be applied to the transistor 122a illustrated in FIG. 2A or FIG. 2B.

A first terminal of the capacitor 523 is electrically connected to the second terminal of the transistor 521, and a second terminal of the capacitor 523 is electrically connected to the second terminal of the antenna 511.

The protection circuit 503 includes a resistor 531, a transistor 532a, a transistor 532b, a transistor 532c, a transistor 532d, a transistor 533, a resistor 534, a capacitor 535, and a transistor 536.

A first terminal of the resistor 531 is electrically connected to the first terminal of the capacitor 523. Note that a point at which the first terminal of the resistor 531 is connected to the first terminal of the capacitor 523 is also referred to as a node N54.

A first terminal of the transistor 532a is electrically connected to a second terminal of the resistor 531. Since a gate of the transistor 532a is electrically connected to the first terminal of the transistor 532a, the transistor 532a has a function of a rectifier element. The transistor 532a has n-type conductivity.

A first terminal of the transistor 532b is electrically connected to a second terminal of the transistor 532a. Since a gate of the transistor 532b is electrically connected to the first terminal of the transistor 532b, the transistor 532b has a function of a rectifier element. The transistor 532b has n-type conductivity.

A first terminal of the transistor 532c is electrically connected to a second terminal of the transistor 532b. Since a gate of the transistor 532c is electrically connected to the first terminal of the transistor 532c, the transistor 532c has a function of a rectifier element. The transistor 532c has n-type conductivity.

A first terminal of the transistor 532d is electrically connected to a second terminal of the transistor 532c, and a second terminal of the transistor 532d is electrically connected to the second terminal of the antenna 511. Since a gate of the transistor 532d is electrically connected to the first terminal of the transistor 532d, the transistor 532d has a function of a rectifier element. The transistor 532d has n-type conductivity.

As the transistors 532a to 532d, it is possible to use, for example, a transistor including an oxide semiconductor layer which can be applied to the transistor 122a illustrated in FIG. 2A or FIG. 2B.

A first terminal of the transistor 533 is electrically connected to the first terminal of the capacitor 523, and a gate of the transistor 533 is electrically connected to the second terminal of the resistor 531. Note that a point at which the gate of the transistor 533 is connected to the second terminal of the resistor 531 is also referred to as a node N55. The transistor 533 has p-type conductivity.

As the transistor 533, for example, a transistor including a single crystal semiconductor can be used.

A first terminal of the resistor 534 is electrically connected to a second terminal of the transistor 533, and a second terminal of the resistor 534 is electrically connected to the second terminal of the antenna 511. Note that a point at which the first terminal of the resistor 534 is connected to the second terminal of the transistor 533 is also referred to as a node N56.

The capacitor 535 has a function of reducing the voltage applied between a source and a drain of the transistor 536. A first terminal of the capacitor 535 is electrically connected to the first terminal of the antenna 511.

A first terminal of the transistor 536 is electrically connected to a second terminal of the capacitor 535, and a second terminal of the transistor 536 is electrically connected to the second terminal of the antenna 511. Note that the transistor 536 has n-type conductivity.

As the transistor 536, it is possible to use, for example, a transistor including an oxide semiconductor layer which can be applied to the transistor 122a illustrated in FIG. 2A or FIG. 2B.

The power supply voltage generation circuit 504 has a function of smoothing the voltage applied between the node N54 and the node N52, namely, an output voltage of the rectifier circuit 502, and generating a power supply voltage with use of the smoothed voltage. Note that the power supply voltage generation circuit 504 may have a DC converter circuit (e.g., a step-up circuit or a step-down circuit), so that the output voltage of the rectifier circuit 502 can be converted to a desired voltage with the DC converter circuit and a power supply voltage can be generated by smoothing the converted voltage.

Further, the semiconductor device illustrated in FIG. 6 includes a filter circuit 506, and the filter circuit 506 includes a resistor 507 and a capacitor 508.

A first terminal of the resistor 507 is electrically connected to the second terminal of the transistor 533, and a second terminal of the resistor 507 is electrically connected to a gate of the transistor 536.

A first terminal of the capacitor 508 is electrically connected to the second terminal of the resistor 507, and a second terminal of the capacitor 508 is electrically connected to the second terminal of the antenna 511.

Although the filter circuit 506 is not necessarily provided in the semiconductor device in this embodiment, the filter circuit 506 allows reducing the noise of a voltage generated in the antenna circuit 501.

Next, an example of the operation of the semiconductor device illustrated in FIG. 5 will be described as an example of the operation of the semiconductor device in this embodiment.

First, a carrier wave is received by the antenna 511.

When the antenna 511 receives a carrier wave, a voltage V61 is generated between the node N51 and the node N52 in accordance with the received carrier wave.

Further, a voltage V62 applied between the node N53 and the node N52 is changed depending on the voltage V61.

The voltage V62 is rectified by the rectifier circuit 502 and a rectified voltage V63 is output through the node N54 and the node N52.

Then, the voltage V63 is input to the protection circuit 503.

In the protection circuit 503, the voltage V63 is divided by the resistor 531 and the transistors 532a to 532d. At this time, the voltage of the node N55 becomes equal to the divided voltage V63. The transistor 533 is turned on or off depending on the voltage of the node N55.

For example, when the absolute value of the voltage of the node N55 is equal to or lower than a reference value, the voltage of the node N55 is close to the potential of the node N54, whereby the transistor 533 is turned off. At this time, the voltage of the node N56 is substantially equal to the potential of the node N52 and the transistor 536 is turned off, so that the value of the voltage V61 is not changed substantially.

When the absolute value of the voltage of the node N55 is higher than the reference value, the voltage of the node N55 is close to the potential of the node N52, whereby the transistor 533 is turned on. At this time, the voltage of the node N56 is determined by the amount of current flowing between a source and a drain of the transistor 533, and the transistor 536 is turned on in accordance with the voltage of the node N56, so that the value of the voltage V61 is changed. The amount of change of the voltage V61 is determined by the amount of current flowing between a source and a drain of the transistor 536.

Further, the voltage V63 is input to the power supply voltage generation circuit 504.

In the power supply voltage generation circuit 504, a power supply voltage Vp is generated with use of the input voltage V63, and the generated power supply voltage Vp is output. That is an example of the operation of the semiconductor device illustrated in FIG. 5.

As described above, the example of the semiconductor device in this embodiment generates a power supply voltage through wireless communication. Since the semiconductor device that is an example of this embodiment includes a protection circuit, when a power supply voltage is generated through wireless communication, damage on an element can be prevented even in the case where a voltage high enough to break the element is input to the semiconductor device.

Note that this embodiment can be combined with or replaced by any of the other embodiments, as appropriate.

Embodiment 5

In this embodiment, a semiconductor device capable of transmitting and receiving signals (also referred to as signal communication) through wireless communication will be described as an example of the semiconductor devices shown in the above embodiments.

Figure 7:
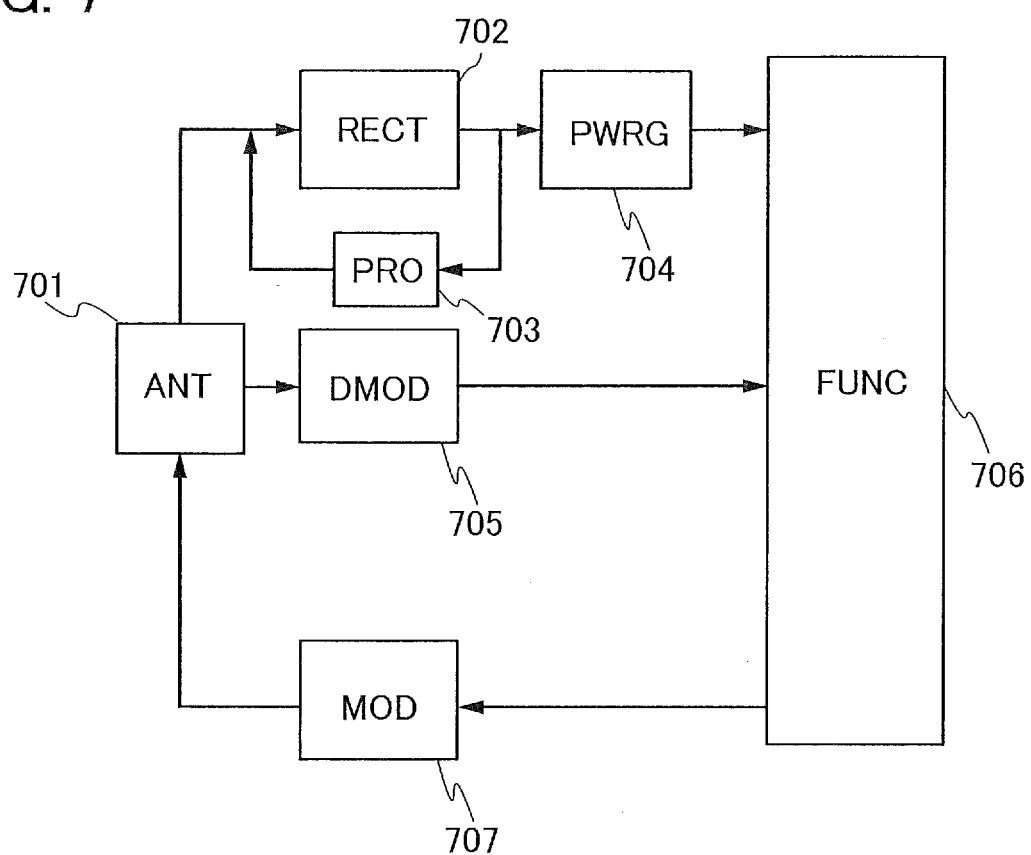
FIG. 7 is a block diagram illustrating an example of a configuration of a semiconductor device in Embodiment 5.

First, an example of a configuration of the semiconductor device in this embodiment will be described with reference to FIG. 7. FIG. 7 is a block diagram illustrating an example of the configuration of the semiconductor device in this embodiment.

The semiconductor device illustrated in FIG. 7 includes an antenna circuit 701 which transmits and receives a carrier wave, a rectifier circuit 702 which rectifies an input voltage, a protection circuit 703 which controls the value of the input voltage, a power supply voltage generation circuit 704 which generates a power supply voltage in accordance with the input voltage, a demodulation circuit (also referred to as DMOD) 705 which demodulates a voltage signal based on the carrier wave received by the antenna circuit 701, a functional circuit (also referred to as FUNC) 706 which operates with a power supply voltage and carries out processing based on the voltage signal demodulated by the demodulation circuit 705, and a modulation circuit (also referred to as MOD) 707 which modulates a carrier wave to be transmitted in accordance with the response signal.

The antenna circuit 701 has a function of transmitting and receiving a carrier wave.

A voltage based on the carrier wave received by the antenna circuit 701 is input to the rectifier circuit 702. The rectifier circuit 702 has a function of rectifying the voltage.

The voltage rectified by the rectifier circuit 702 is input to the protection circuit 703. The protection circuit 703 has a function of controlling the value of a voltage input to the rectifier circuit 702 in accordance with in accordance with the input voltage.

As the rectifier circuit 702 and the protection circuit 703, the rectifier circuit and the protection circuit in any of the semiconductor devices shown in the above embodiments can be used.

The voltage rectified by the rectifier circuit 702 is input to the power supply voltage generation circuit 704. The power supply voltage generation circuit 704 has a function of generating a power supply voltage Vp in accordance with the input voltage.

The demodulation circuit 705 has a function of demodulating the carrier wave received by the antenna circuit 701 to extract a data signal.

The data signal is input from the demodulation circuit 705 to the functional circuit 706. The functional circuit 706 has a function of carrying out processing based on the data signal.

The functional circuit 706 includes, for example, a memory in which specific data or the like is stored, a memory controller which controls the access to the memory, a logic circuit which generates a response signal after the processing based on a demodulated signal is carried out, and an interface which converts the response signal in accordance with an external apparatus. These circuits operate when the power supply voltage Vp is input.

The response signal is input from the functional circuit 706 to the modulation circuit 707. The modulation circuit 707 has a function of modulating a carrier wave to be transmitted in accordance with the response signal as needed.

Next, an example of the operation of the semiconductor device illustrated in FIG. 7 will be described.

First, an externally applied carrier wave is received by the antenna circuit 701.

When the antenna circuit 701 receives a carrier wave, a voltage is generated in accordance with the received carrier wave.

The voltage generated in accordance with the carrier wave received by the antenna circuit 701 is input to the rectifier circuit 702 and the demodulation circuit 705.

Then, the rectifier circuit 702 rectifies the input voltage and outputs the rectified voltage.

The output voltage of the rectifier circuit 702 is input to the protection circuit 703.

When the absolute value of a voltage input to the rectifier circuit 702 is equal to or lower than a reference value, the value of a voltage input from the protection circuit 703 to the rectifier circuit 702 is not changed substantially.

When the absolute value of the voltage input to the rectifier circuit 702 is higher than the reference value, the value of a voltage input from the protection circuit 703 to the rectifier circuit 702 is changed. The amount of change of the voltage input to the rectifier circuit 702 at this time is determined by the voltage input to the rectifier circuit 702 and the voltage output from the rectifier circuit 702.

The output voltage of the rectifier circuit 702 is input to the power supply voltage generation circuit 704.

The power supply voltage generation circuit 704 generates a power supply voltage Vp in accordance with the input voltage, and outputs the generated power supply voltage Vp.

The power supply voltage Vp is input to the functional circuit 706.

The demodulation circuit 705 demodulates the carrier wave input from the antenna circuit 701 to extract a data signal, and outputs the extracted data signal.

The data signal is input to the functional circuit 706.

The functional circuit 706 operates when the power supply voltage Vp is supplied, and carries out processing based on the data signal; further, generates a response signal as needed and outputs the generated response signal.

The response signal is input to the modulation circuit 707.

When the response signal is input to the modulation circuit 707, a carrier wave to be transmitted from the antenna circuit 701 is modulated as needed in accordance with the response signal. That is an example of the operation of the semiconductor device illustrated in FIG. 7.

As illustrated in the example of FIG. 7, the example of the semiconductor device in this embodiment generates a power supply voltage through wireless communication, and further carries out processing based on a received carrier wave with use of the power supply voltage, generates a response signal as needed, and modulates a carrier wave to be transmitted in accordance with the response signal as needed. In addition, the semiconductor device in this embodiment includes a protection circuit. In general, when a power supply voltage is generated through wireless communication, a voltage generated by the antenna circuit is considerably changed depending on a communication distance or the like. Even in such a case, damage on an element can be prevented with the protection circuit.

Note that this embodiment can be combined with or replaced by any of the other embodiments, as appropriate.

Embodiment 6

In this embodiment, an example of the transistor that can be applied to any of the semiconductor devices shown in the above embodiments will be described.

As a structure of the transistor that can be applied to any of the semiconductor devices shown in the above embodiments, for example, a top-gate structure or a bottom-gate structure can be used. As the bottom-gate structure, for example, a staggered structure or a planar structure can be used.

Further, the transistor that can be applied to any of the semiconductor devices shown in the above embodiments may have a structure including one channel formation region (also referred to as a single-gate structure), a structure including a plurality of channel formation regions (also referred to as a multi-gate structure), or a structure in which two conductive layers are provided over and under a channel region each with an insulating layer interposed therebetween (also referred to as a dual-gate structure).

An example of a structure of the transistor in this embodiment will be described with reference to FIGS. 8A to 8D. FIGS. 8A to 8D are cross-sectional schematic diagrams each illustrating an example of the structure of the transistor in this embodiment.

Figure 8A:
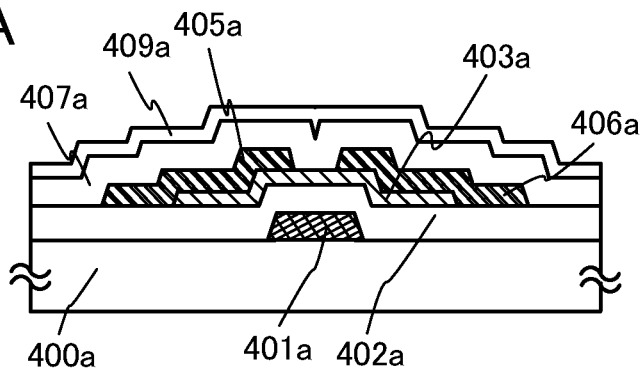
FIGS. 8A to 8D are cross-sectional schematic diagrams each illustrating an example of a structure of a transistor in Embodiment 6.

The transistor illustrated in FIG. 8A is one of bottom-gate transistors, which is also referred to as an inverted staggered transistor.

The transistor illustrated in FIG. 8A includes a conductive layer 401*a* serving as a gate electrode, an insulating layer 402*a* serving as a gate insulating layer, an oxide semiconductor layer 403*a* serving as a channel formation layer, and a conductive layer 405*a* and a conductive layer 406*a* serving as a source or drain electrode.

The conductive layer 401*a* is provided over a substrate 400*a*, the insulating layer 402*a* is provided over the conductive layer 401*a*, the oxide semiconductor layer 403*a* is provided over the conductive layer 401*a* with the insulating layer 402*a* interposed therebetween, and the conductive layer 405*a* and the conductive layer 406*a* are each provided over part of the oxide semiconductor layer 403*a*.

Further, in the transistor illustrated in FIG. 8A, an oxide insulating layer 407*a* is in contact with part of a top surface of the oxide semiconductor layer 403*a* (part of the oxide semiconductor layer 403*a* over which the conductive layer 405*a* and the conductive layer 406*a* are not provided). A protective insulating layer 409*a* is provided over the oxide insulating layer 407*a*.

Figure 8B:
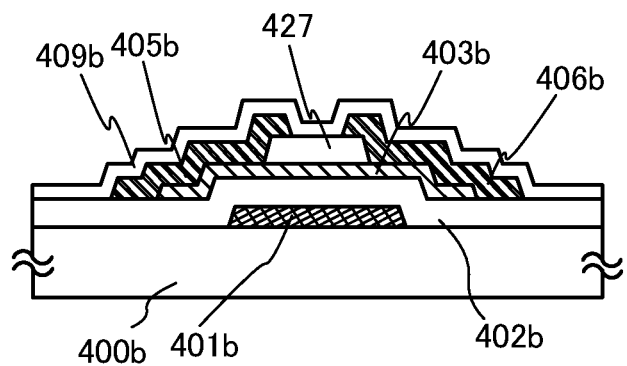

The transistor illustrated in FIG. 8B is a channel protective (also referred to as a channel stop) transistor which is one of the bottom-gate transistors, and is also referred to as an inverted staggered transistor.

The transistor illustrated in FIG. 8B includes a conductive layer 401*b* serving as a gate electrode, an insulating layer 402*b* serving as a gate insulating layer, an oxide semiconductor layer 403*b* serving as a channel formation layer, an insulating layer 427 serving as a channel protective layer, and a conductive layer 405*b* and a conductive layer 406*b* serving as a source or drain electrode.

The conductive layer 401*b* is provided over a substrate 400*b*, the insulating layer 402*b* is provided over the conductive layer 401*b*, the oxide semiconductor layer 403*b* is provided over the conductive layer 401*b* with the insulating layer 402*b* interposed therebetween, the insulating layer 427 is provided over the conductive layer 401*b* with the insulating layer 402*b* and the oxide semiconductor layer 403*b* interposed therebetween, and the conductive layer 405*b* and the conductive layer 406*b* are each provided over part of the oxide semiconductor layer 403*b* with the insulating layer 427 interposed therebetween.

Further, a protective insulating layer 409*b* is in contact with a top part of the transistor illustrated in FIG. 8B.

Figure 8C:
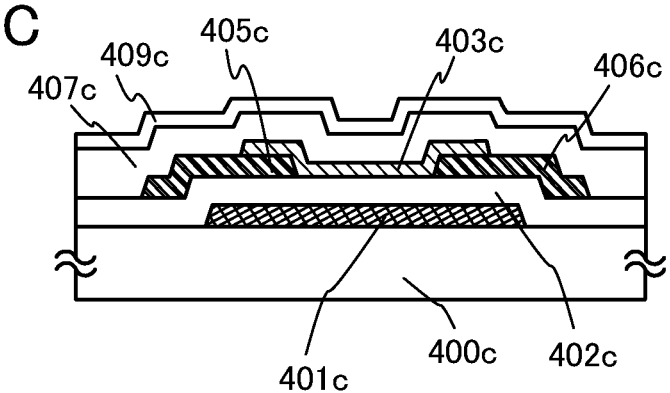

The transistor illustrated in FIG. 8C is one of the bottom-gate transistors.

The transistor illustrated in FIG. 8C includes a conductive layer 401*c* serving as a gate electrode, an insulating layer 402*c* serving as a gate insulating layer, an oxide semiconductor layer 403*c* serving as a channel formation layer, and a conductive layer 405*c* and a conductive layer 406*c* serving as a source or drain electrode.

The conductive layer 401*c* is provided over a substrate 400*c*, the insulating layer 402*c* is provided over the conductive layer 401*c*, the conductive layer 405*c* and the conductive layer 406*c* are provided over part of the insulating layer 402*c*, and the oxide semiconductor layer 403*c* is provided over the conductive layer 401*c* with the insulating layer 402*c*, the conductive layer 405*c*, and the conductive layer 406*c* interposed therebetween.

Further, in the transistor illustrated in FIG. 8C, an oxide insulating layer 407*c* is in contact with a top surface and a side surface of the oxide semiconductor layer 403*c*. In addition, a protective insulating layer 409*c* is provided over the oxide insulating layer 407*c*.

Figure 8D:
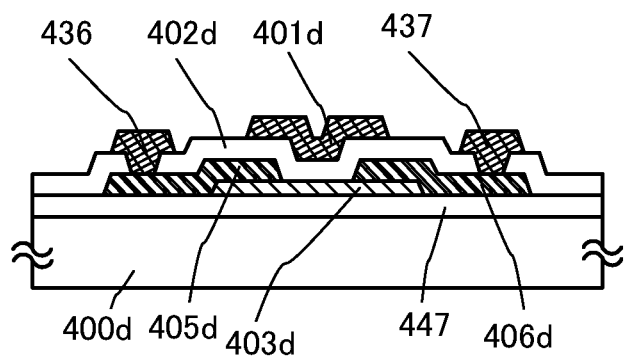

The transistor illustrated in FIG. 8D is one of top-gate transistors.

The transistor illustrated in FIG. 8D includes a conductive layer 401*d* serving as a gate electrode, an insulating layer 402*d* serving as a gate insulating layer, an oxide semiconductor layer 403*d* serving as a channel formation layer, and a conductive layer 405*d* and a conductive layer 406*d* serving as a source or drain electrode.

The oxide semiconductor layer 403d is provided over a substrate 400d with a base layer 447 interposed therebetween, the conductive layer 405d and the conductive layer 406d are each provided over part of the oxide semiconductor layer 403d, the insulating layer 402d is provided over the oxide semiconductor layer 403d, the conductive layer 405d, and the conductive layer 406d, and the conductive layer 401d is provided over the oxide semiconductor layer 403d with the insulating layer 402d interposed therebetween.

Further, in the transistor illustrated in FIG. 8D, the conductive layer 405d is in contact with a wiring layer 436 through an opening portion formed in the insulating layer 402d, and the conductive layer 406d is in contact with a wiring layer 437 through an opening portion formed in the insulating layer 402d.

As the substrates 400a to 400d, for example, a glass substrate such as a barium borosilicate glass substrate or an aluminoborosilicate glass substrate can be used.

Alternatively, a substrate formed of an insulator, such as a ceramic substrate, a quartz substrate, or a sapphire substrate can be used as the substrates 400a to 400d. Further alternatively, crystallized glass can be used for the substrates 400a to 400d. Still further alternatively, a plastic substrate or a semiconductor substrate of silicon or the like can be used as the substrates 400a to 400d.

The base layer 447 has a function of preventing diffusion of an impurity element from the substrate 400d. As the base layer 447, a silicon nitride layer, a silicon oxide layer, a silicon nitride oxide layer, a silicon oxynitride layer, an aluminum oxide layer, or an aluminum oxynitride layer can be used, for example. The base layer 447 can also be formed by stacking layers of materials which can be applied to the base layer 447.

Note that in the transistors illustrated in FIGS. 8A to 8C, a base layer may be provided between the substrate and the conductive layer serving as a gate electrode, as in the transistor illustrated in FIG. 8D.

As the conductive layers 401a to 401d, it is possible to use, for example, a layer of a metal material such as molybdenum, titanium, chromium, tantalum, tungsten, aluminum, copper, neodymium, or scandium or an alloy material containing any of these materials as a main component. The conductive layers 401a to 401d can also be formed by stacking layers of materials which can be applied to the conductive layers 401a to 401d.

As the insulating layers 402a to 402d, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layers 402a to 402d can also be formed by stacking layers of materials which can be applied to the insulating layers 402a to 402d. The layers of materials which can be applied to the insulating layers 402a to 402d can be formed by plasma CVD, sputtering, or the like. For example, the insulating layers 402a to 402d can be formed in such a manner that a silicon nitride layer is formed by plasma CVD and a silicon oxide layer is formed over the silicon nitride layer by plasma CVD.

As an oxide semiconductor which can be used for the oxide semiconductor layers 403a to 403d, for example, a four-component metal oxide, a three-component metal oxide, or a two-component metal oxide can be given. As the four-component metal oxide, for example, an In—Sn—Ga—Zn—O-based metal oxide can be used. As the three-component metal oxide, for example, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide can be used. As the two-component metal oxide, for example, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Sn—O-based metal oxide can be used. In addition, an In—O-based metal oxide, a Sn—O-based metal oxide, a Zn—O-based metal oxide, or the like can also be used as the oxide semiconductor. The metal oxide that can be used as the oxide semiconductor may contain $SiO_2$. Here, for example, the In—Ga—Zn—O-based metal oxide means an oxide containing at least In, Ga, and Zn, and the composition ratio of the elements is not particularly limited. The In—Ga—Zn—O-based metal oxide may contain an element other than In, Ga, and Zn.

Further, as an oxide semiconductor which can be used for the oxide semiconductor layers 403a to 403d, a metal oxide represented by a chemical formula $InMO_3(ZnO)_m$ (m>0, and m is not a natural number) can be used. Here, M denotes one or more of metal elements selected from Ga, Al, Mn, and Co. For example, M can be Ga, Ga and Al, Ga and Mn, or Ga and Co.

As the conductive layers 405a to 405d and the conductive layers 406a to 406d, a layer of a metal material such as aluminum, chromium, copper, tantalum, titanium, molybdenum, or tungsten or an alloy material containing any of the metal materials as a main component can be used, for example. The conductive layers 405a to 405d and the conductive layers 406a to 406d can also be formed by stacking layers of materials which can be applied to the conductive layers 405a to 405d and the conductive layers 406a to 406d.

For example, the conductive layers 405a to 405d and the conductive layers 406a to 406d can be formed by stacking a metal layer of aluminum or copper and a high-melting-point metal layer of titanium, molybdenum, tungsten, or the like. The conductive layers 405a to 405d and the conductive layers 406a to 406d may have a structure in which a metal layer of aluminum or copper is provided between a plurality of high-melting-point metal layers. Further, when the conductive layers 405a to 405d and the conductive layers 406a to 406d are formed using an aluminum layer to which an element that prevents generation of hillocks or whiskers (e.g., Si, Nd, or Si) is added, heat resistance can be increased.

Alternatively, the conductive layers 405a to 405d and the conductive layers 406a to 406d can be formed using a layer containing a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or such a metal oxide material containing silicon oxide can be used, for example.

Furthermore, another wiring may be formed using the material used to form the conductive layers 405a to 405d and the conductive layers 406a to 406d.

As the wiring layer 436 and the wiring layer 437, a layer of a material which can be applied to the conductive layers 405a to 405d and the conductive layers 406a to 406d can be used. The wiring layer 436 and the wiring layer 437 can also be formed by stacking layers of materials which can be applied to the wiring layer 436 and the wiring layer 437.

As the insulating layer 427, a layer which can be applied to the base layer 447 can be used, for example. The insulating layer 427 can also be formed by stacking layers of materials which can be applied to the insulating layer 427.

As the oxide insulating layer 407a and the oxide insulating layer 407c, an oxide insulating layer such as a silicon oxide layer can be used. The oxide insulating layer 407a and the oxide insulating layer 407c can also be formed by stacking layers of materials which can be applied to the oxide insulating layer 407a and the oxide insulating layer 407c.

As the protective insulating layers 409a to 409c, an inorganic insulating layer such as a silicon nitride layer, an aluminum nitride layer, a silicon nitride oxide layer, or an aluminum nitride oxide layer can be used, for example. The protective insulating layers 409a to 409c can also be formed by stacking layers of materials which can be applied to the protective insulating layers 409a to 409c.

Note that in the semiconductor devices in the above embodiments, in order to reduce surface unevenness due to the transistor of this embodiment, a planarization insulating layer can be provided over the transistor (in the case where the transistor includes an oxide insulating layer or a protective insulating layer, over the transistor with the oxide insulating layer or the protective insulating layer interposed therebetween). As the planarization insulating layer, a layer of an organic material such as polyimide, acrylic, or benzocyclobutene can be used. Alternatively, a layer of a low-dielectric constant material (a low-k material) can be used as the planarization insulating layer. The planarization insulating layer can also be formed by stacking layers of materials which can be applied to the planarization insulating layer.

Next, as an example of a method for manufacturing the transistor in this embodiment, an example of a method for manufacturing the transistor illustrated in FIG. 8A will be described with reference to FIGS. 9A to 9E. FIGS. 9A to 9E are cross-sectional schematic diagrams illustrating an example of the manufacturing method of the transistor illustrated in FIG. 8A. Although an example of the manufacturing method of the transistor illustrated in FIG. 8A will be shown as an example of the method for manufacturing the transistor in this embodiment, the present invention is not limited to this example. For example, as for the components of FIGS. 8B to 8D which have the same designations as the components of FIG. 8A and whose function is at least partly the same as that of the components of FIG. 8A, description of the example of the manufacturing method of the transistor illustrated in FIG. 8A can be referred to as appropriate.

First, the substrate 400a is prepared, and a first conductive film is formed over the substrate 400a.

A glass substrate is used as an example of the substrate 400a.

As the first conductive film, a film of a metal material such as molybdenum, titanium, chromium, tantalum, tungsten, aluminum, copper, neodymium, or scandium, or an alloy material which contains any of the metal materials as a main component can be used. The first conductive film can also be formed by stacking layers of materials which can be applied to the first conductive film.

Next, a first photolithography process is carried out: a first resist mask is formed over the first conductive film, the first conductive film is selectively etched with use of the first resist mask to form the conductive layer 401a, and the first resist mask is removed.

Note that in this embodiment, the resist mask may be formed by an ink-jet method. Formation of the resist mask by an inkjet method needs no photomask; thus, manufacturing cost can be reduced.

In order to reduce the number of photomasks and steps in the photolithography process, the etching step may be performed using a resist mask formed with a multi-tone mask. The multi-tone mask is a mask through which light is transmitted to have a plurality of intensities. A resist mask formed with use of the multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed with one multi-tone mask. Thus, the number of light-exposure masks can be reduced and the number of corresponding photolithography steps can also be reduced, whereby a manufacturing process can be simplified.

Next, the insulating layer 402a is formed over the conductive layer 401a.

For example, the insulating layer 402a can be formed by high-density plasma CVD. For example, high-density plasma CVD is preferably performed using microwaves (e.g., microwaves with a frequency of 2.45 GHz) in order to form a dense insulating layer having high withstand voltage and high quality. When the oxide semiconductor layer is in contact with the high-quality insulating layer formed by high-density plasma CVD, the interface state can be reduced and good interface characteristics can be obtained.

The insulating layer 402a can also be formed by another method such as sputtering or plasma CVD. Further, heat treatment may be performed after the formation of the gate insulating layer 402a. The heat treatment can improve the quality of the insulating layer 402a and the interface characteristics between the insulating layer 402a and the oxide semiconductor.

Next, an oxide semiconductor film 530 having a thickness of 2 nm to 200 nm inclusive, preferably 5 nm to 30 nm inclusive is formed over the insulating layer 402a. For example, the oxide semiconductor film 530 can be formed by sputtering.

Note that before the formation of the oxide semiconductor film 530, powdery substances (also referred to as particles or dust) attached on a surface of the insulating layer 402a are preferably removed by reverse sputtering in which an argon gas is introduced and plasma is generated. The reverse sputtering refers to a method in which, without application of voltage to a target side, an RF power source is used for application of voltage to a substrate side in an argon atmosphere, so that plasma is generated to modify a surface of the substrate. Note that instead of argon, nitrogen, helium, oxygen, or the like may be used.

For example, the oxide semiconductor film 530 can be formed using an oxide semiconductor material which can be used as a material of the oxide semiconductor layer 403a. In this embodiment, the oxide semiconductor film 530 is formed by sputtering with use of an In—Ga—Zn—O-based oxide target. A cross-sectional view at this stage corresponds to FIG. 9A. Alternatively, the oxide semiconductor film 530 can be formed by sputtering in a rare gas (typically, argon) atmosphere, an oxygen atmosphere, or a mixed atmosphere of a rare gas and oxygen.

As a target for forming the oxide semiconductor film 530 by sputtering, for example, an oxide target having a composition ratio of $In_2O_3:Ga_2O_3:ZnO=1:1:1$ [molar ratio] can be used. Without limitation to the above target, an oxide target having a composition ratio of $In_2O_3:Ga_2O_3:ZnO=1:1:2$ [molar ratio] may be used, for example. The proportion of the volume of a portion except for an area occupied by a space and the like with respect to the total volume of the oxide target (also referred to as the filling rate) is 90% to 100% inclusive, and preferably 95% to 99.9% inclusive. The oxide semiconductor film formed using a metal oxide target having high filling rate has high density.

Note that as a sputtering gas used for forming the oxide semiconductor film 530, for example, a high-purity gas from which an impurity such as hydrogen, water, hydroxyl groups, or hydride is removed is preferably used.

Before formation of the oxide semiconductor film 530, it is preferable that the substrate 400a over which the conductive layer 401a is formed or the substrate 400a over which the conductive layer 401a and the insulating layer 402a are formed be preheated in a preheating chamber in the sputtering apparatus, so that an impurity such as hydrogen or moisture adsorbed on the substrate 400a is eliminated and removed. The preheating can prevent hydrogen, hydroxyl groups, and moisture from entering the insulating layer 402a and the oxide semiconductor film 530. Note that a cryopump is preferably used as an exhaustion unit provided in the preheating chamber. The preheating treatment may be omitted. Further, the preheating may be similarly performed before formation of the oxide insulating layer 407a, on the substrate 400a over which layers up to the conductive layer 405a and the conductive layer 406a have been formed.

When the oxide semiconductor film 530 is formed by sputtering, the substrate 400a is held inside a film formation chamber which is kept in a reduced pressure state, and the substrate temperature is set to 100° C. to 600° C. inclusive, preferably 200° C. to 400° C. inclusive. By heating the substrate 400a, the concentration of an impurity contained in the oxide semiconductor film 530 can be reduced. Further, heating of the substrate 400a can reduce damage on the oxide semiconductor film 530 due to sputtering. Then, a sputtering gas from which hydrogen and moisture are removed is introduced while remaining moisture in the film formation chamber is removed, and the above-described target is used; thus, the oxide semiconductor film 530 is formed over the substrate 400a.

In order to remove remaining moisture in the film formation chamber, an entrapment vacuum pump such as a cryopump, an ion pump, or a titanium sublimation pump is preferably used. Further, the exhaustion unit may be a turbo pump provided with a cold trap. In the case where the film formation chamber is exhausted with a cryopump, a hydrogen atom, a compound containing a hydrogen atom (such as water), and further preferably, a compound containing a hydrogen atom and a carbon atom, or the like is removed. Accordingly, with a cryopump, the concentration of an impurity contained in the oxide semiconductor film 530 that is formed in the film formation chamber can be reduced.

As one example of the film formation conditions, the following can be employed: the distance between the substrate 400 and the target is 100 mm, the pressure is 0.6 Pa, the direct-current (DC) power is 0.5 kW, and the atmosphere is an oxygen atmosphere (the proportion of oxygen flow is 100%). Note that a pulsed direct-current power supply is preferably used because powdery substances generated at the time of film formation can be reduced and the film thickness can be made uniform.

Next, a second photolithography process is carried out: a second resist mask is formed over the oxide semiconductor film 530, the oxide semiconductor film 530 is selectively etched with use of the second resist mask to process the oxide semiconductor film 530 into an island-shaped oxide semiconductor layer, and the second resist mask is removed.

In the case of forming a contact hole in the insulating layer 402a, the contact hole can be formed at the time of processing the oxide semiconductor film 530 into the island-shaped oxide semiconductor layer.

For example, dry etching, wet etching, or both dry etching and wet etching can be employed for etching the oxide semiconductor film 530. As an etchant used for wet etching of the oxide semiconductor film 530, a mixed solution of phosphoric acid, acetic acid, and nitric acid can be used, for example. Further, ITO07N (produced by KANTO CHEMICAL CO., INC.) may also be used.

Next, the oxide semiconductor layer is subjected to first heat treatment. Through the first heat treatment, the oxide semiconductor layer can be dehydrated or dehydrogenated. The temperature of the first heat treatment is 400° C. to 750° C. inclusive, or equal to or higher than 400° C. and lower than the strain point of the substrate. Here, the substrate is put in an electric furnace that is a kind of heat treatment apparatus and heat treatment is performed on the oxide semiconductor layer in a nitrogen atmosphere at 450° C. for one hour, and then the oxide semiconductor layer is not exposed to the air so that entry of water and hydrogen into the oxide semiconductor layer is prevented. In this manner, the oxide semiconductor layer 403a is obtained (see FIG. 9B).

The heat treatment apparatus is not limited to the electric furnace and may be the one provided with a device for heating a process object using heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a process object by heat treatment, such as nitrogen or a rare gas like argon, is used.

For example, as the first heat treatment, GRTA may be performed in the following manner. The substrate is transferred to an inert gas which has been heated to a high temperature of 650° C. to 700° C., heated for several minutes, and transferred from the heated inert gas.

Note that in the first heat treatment, it is preferable that water, hydrogen, and the like be not contained in nitrogen or a rare gas such as helium, neon, or argon. It is also preferable that nitrogen or a rare gas such as helium, neon, or argon introduced into the heat treatment apparatus have a purity of 6N (99.9999%) or more, preferably, 7N (99.99999%) or more (that is, the impurity concentration is set to be equal to or lower than 1 ppm, preferably, equal to or lower than 0.1 ppm).

After the oxide semiconductor layer is heated by the first heat treatment, a high-purity oxygen gas, a high-purity $N_2O$ gas, or ultra-dry air (having a dew point of −40° C. or lower, preferably −60° C. or lower) may be introduced into the same furnace. It is preferable that the oxygen gas or the $N_2O$ gas do not contain water, hydrogen, and the like. The purity of the oxygen gas or the $N_2O$ gas which is introduced into the heat treatment apparatus is preferably equal to or more than 6N, more preferably equal to or more than 7N (i.e., the impurity concentration of the oxygen gas or the $N_2O$ gas is preferably equal to or lower than 1 ppm, more preferably equal to or lower than 0.1 ppm). By the effect of the oxygen gas or the $N_2O$ gas, oxygen that has been reduced through the step of eliminating an impurity by the dehydration or dehydrogenation treatment is supplied; thus, the oxide semiconductor layer 403a is highly purified.

The first heat treatment may also be performed on the oxide semiconductor film 530 that has not been processed into the island-shaped oxide semiconductor layer. In such a case, the substrate is taken out of the heating apparatus after the first heat treatment and then the oxide semiconductor film 530 is processed into the island-shaped oxide semiconductor layer.

Other than the above-described timings, the first heat treatment may be performed after the formation of the oxide semiconductor layer, for example, after formation of the conductive layer 405a and the conductive layer 406a over the oxide semiconductor layer 403a or after formation of the oxide insulating layer 407a over the conductive layer 405a and the conductive layer 406a.

In the case of forming a contact hole in the insulating layer 402a, the contact hole may be formed before the first heat treatment is performed.

The oxide semiconductor layer may be formed using an oxide semiconductor film which is formed through two deposition steps so as to be a thick film including a crystalline region (a single crystal region), that is, a crystalline region having a c-axis aligned in a direction perpendicular to a surface of the film, regardless of the material of a base component such as an oxide, a nitride, or a metal. For example, a first oxide semiconductor film with a thickness of 3 nm to 15 nm inclusive is deposited and subjected to first heat treatment at a temperature of 450° C. to 850° C. inclusive, preferably 550° C. to 750° C. inclusive under an atmosphere of nitrogen, oxygen, a rare gas, or dry air, so that the first oxide semiconductor film which includes a crystalline region (including a plate-like crystal) in a region including a surface is formed. Then, a second oxide semiconductor film that is thicker than the first oxide semiconductor film is formed and subjected to second heat treatment at a temperature of 450° C. to 850° C. inclusive, preferably 600° C. to 700° C. inclusive, so that crystal growth proceeds toward the upper side from the first oxide semiconductor film to the second oxide semiconductor film using the first oxide semiconductor film as a seed of the crystal growth, and the entire region of the second oxide semiconductor film is crystallized. Using the film including a crystalline region, which is thick as a consequence, an oxide semiconductor layer may be formed.

Next, a second conductive film is formed over the insulating layer 402a and the oxide semiconductor layer 403a.

As the second conductive film, a film of a metal material such as aluminum, chromium, copper, tantalum, titanium, molybdenum, or tungsten, or an alloy material which contains any of the metal materials as a main component can be used, for example. The second conductive film can also be formed by stacking films of materials which can be applied to the second conductive film.

Figure 9A:
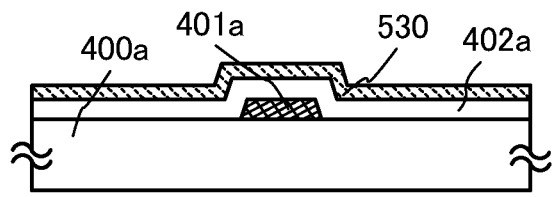
FIGS. 9A to 9E are cross-sectional schematic diagrams illustrating an example of a method for manufacturing a transistor in Embodiment 6.
Figure 9B:
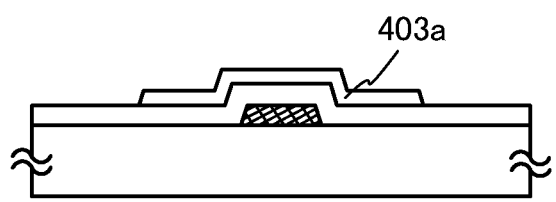
Figure 9C:
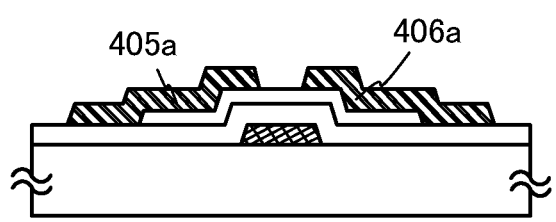

Next, a third photolithography process is carried out: a third resist mask is formed over the second conductive film, the second conductive film is selectively etched with use of the third resist mask to form the conductive layer 405a and the conductive layer 406a, and the third resist mask is removed (see FIG. 9C).

Note that another wiring may be formed using the second conductive film at the time of forming the conductive layer 405a and the conductive layer 406a.

In light exposure in forming the third resist mask, ultraviolet light, KrF laser light, or ArF laser light is preferably used. A channel length L of the transistor to be completed later depends on the width of an interval between a bottom end of the conductive layer 405a and a bottom end of the conductive layer 406a which are adjacent to each other over the oxide semiconductor layer 403a. In the case where the channel length L is less than 25 nm, the light exposure at the time of forming the third resist mask is preferably performed using extreme ultraviolet light having an extremely short wavelength of several nanometers to several tens of nanometers. In light exposure using extreme ultraviolet light, resolution is high and depth of focus is large. Therefore, the channel length L of the transistor to be completed later can be made 10 nm to 1000 nm inclusive, and the use of the transistor formed through such light exposure enables higher speed operation of a circuit. In addition, the off-current of the transistor is extremely low, which results in a reduction in power consumption.

In the case of etching the second conductive film, etching conditions are preferably optimized in order to prevent the oxide semiconductor layer 403a from being divided by the etching. However, it is difficult to set the conditions under which only the second conductive film can be etched and the oxide semiconductor layer 403a is not etched at all. In some cases, part of the oxide semiconductor layer 403a is etched at the time of etching the second conductive film, whereby the oxide semiconductor layer 403a comes to include a groove portion (depression portion).

In this embodiment, a titanium film is used as an example of the second conductive film, an In—Ga—Zn—O-based oxide semiconductor is used as an example of the oxide semiconductor layer 403a, and an ammonia hydrogen peroxide solution (a mixture of ammonia, water, and a hydrogen peroxide solution) is used as an etchant.

Next, the oxide insulating layer 407a is formed over the oxide semiconductor layer 403a, the conductive layer 405a, and the conductive layer 406a. At this time, the oxide insulating layer 407a is in contact with part of the top surface of the oxide semiconductor layer 403a.

The oxide insulating layer 407a can be formed to a thickness of at least 1 nm or more using a method by which impurities such as water or hydrogen are not introduced into the oxide insulating layer 407a, such as a sputtering method, as appropriate. When hydrogen is contained in the oxide insulating layer 407a, entry of the hydrogen to the oxide semiconductor layer, or extraction of oxygen in the oxide semiconductor layer by the hydrogen is caused, thereby causing the backchannel of the oxide semiconductor layer to have lower resistance (to have an n-type conductivity), so that a parasitic channel may be formed. Therefore, in order to form the oxide insulating layer 407a containing as little hydrogen as possible, it is important to employ a formation method in which hydrogen is not used.

In this embodiment, as the oxide insulating layer 407a, a silicon oxide film having a thickness of 200 nm is formed by sputtering. The substrate temperature at the time of the film formation may be room temperature to 300° C. inclusive; in this embodiment, 100° C. as an example. The formation of a silicon oxide film by sputtering can be performed in a rare gas (typically, argon) atmosphere, an oxygen atmosphere, or a mixed atmosphere of a rare gas and oxygen.

Further, a silicon oxide target or a silicon target can be used as a target for forming the oxide insulating layer 407a. For example, with use of a silicon target, a silicon oxide film can be formed by sputtering under an atmosphere containing oxygen.

In order to remove remaining moisture in a film formation chamber that is used for forming the oxide insulating layer 407a, an entrapment vacuum pump (such as a cryopump) is preferably used, for example. By removing remaining moisture in a film formation chamber with a cryopump, the concentration of an impurity contained in the oxide insulating layer 407a can be reduced. As an exhaustion unit for removing remaining moisture in the film formation chamber that is used for forming the oxide insulating layer 407a, for example, a turbo pump provided with a cold trap can be used.

As a sputtering gas used for forming the oxide semiconductor film 407a, for example, a high-purity gas from which an impurity such as hydrogen, water, hydroxyl groups, or hydride is removed is preferably used.

Before formation of the oxide insulating layer 407a, plasma treatment with the use of a gas such as $N_2O$, $N_2$, or Ar may be performed to remove water or the like adsorbed on an exposed surface of the oxide semiconductor layer 403a. In the case where plasma treatment is performed, the oxide insulating layer 407a which is in contact with part of the upper surface of the oxide semiconductor layer 403a is preferably formed without exposure to the air.

Then, second heat treatment (preferably, at a temperature of 200° C. to 400° C. inclusive, for example, 250° C. to 350° C. inclusive) can be performed in an inert gas atmosphere or in an oxygen gas atmosphere. For example, the second heat treatment is performed at 250° C. in a nitrogen atmosphere for one hour. Through the second heat treatment, heat is applied while part of the upper surface of the oxide semiconductor layer 403a is in contact with the oxide insulating layer 407a.

Through the above-described process, the first heat treatment is performed on the oxide semiconductor film, so that an impurity such as hydrogen, moisture, hydroxyl groups, or hydride (also referred to as a hydrogen compound) can be intentionally removed from the oxide semiconductor layer, and in addition, oxygen can be supplied to the oxide semiconductor layer. Therefore, the oxide semiconductor layer is highly purified.

Figure 9D:
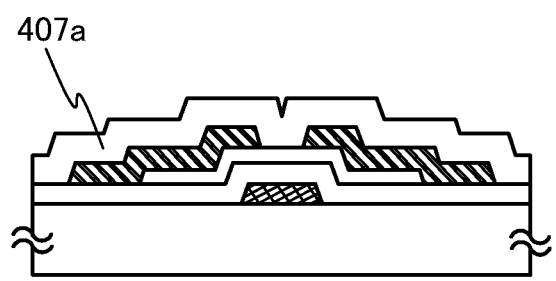
Figure 9E:
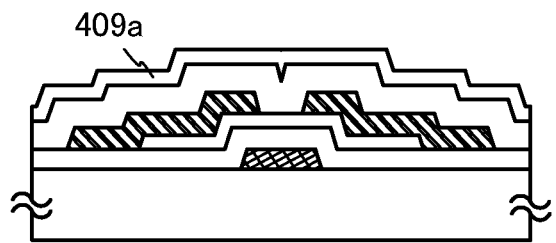

Through the above process, the transistor is completed (see FIG. 9D).

When a silicon oxide layer having many defects is used as the oxide insulating layer 407a, the heat treatment after formation of the silicon oxide layer has an effect of diffusing an impurity such as hydrogen, moisture, hydroxyl groups, or hydride contained in the oxide semiconductor layer 403a to the oxide insulating layer 407a, so that the impurity contained in the oxide semiconductor layer 403a can be further reduced.

The protective insulating layer 409a may be further formed over the oxide insulating layer 407a. For example, a silicon nitride film is formed by RF sputtering. The RF sputtering is preferably used as a formation method of the protective insulating layer 409a because it achieves high mass productivity. In this embodiment, as the protective insulating layer 409a, a silicon nitride film is formed as an example (see FIG. 9E).

In this embodiment, the protective insulating layer 409a is formed in such a manner that the substrate 400a over which layers up to the oxide insulating layer 407a are formed is heated at a temperature of 100° C. to 400° C., a sputtering gas containing high-purity nitrogen from which hydrogen and moisture are removed is introduced, and a silicon nitride film is formed with use of a target of a silicon semiconductor. In that case also, the protective insulating layer 409a is preferably formed while removing remaining moisture in a treatment chamber, similarly to the case of forming the oxide insulating layer 407a.

After formation of the protective insulating layer 409a, heat treatment may be further performed at a temperature of 100° C. to 200° C. inclusive under the air for 1 hour to 30 hours inclusive. The heat treatment may be performed at a fixed heating temperature. Alternatively, the following change in heating temperature may be conducted plural times repeatedly: an increase from room temperature to a temperature of 100° C. to 200° C. inclusive and then a decrease to room temperature. That is an example of the method for manufacturing the transistor illustrated in FIG. 8A.

As described above, the transistor shown in this embodiment is a transistor including an oxide semiconductor layer as a channel formation layer. The oxide semiconductor layer used in the transistor is highly purified by heat treatment and thereby becomes an i-type or substantially i-type oxide semiconductor layer. Such a transistor can be used as a transistor having a high withstand voltage that is used in the semiconductor devices shown in the above embodiments.

The highly-purified oxide semiconductor layer includes extremely few carriers (close to 0). The carrier concentration of the oxide semiconductor layer is less than $1\times10^{14}/cm^3$, preferably less than $1\times10^{12}/cm^3$, and more preferably less than $1\times10^{11}/cm^3$. Since the number of carriers in the oxide semiconductor layer is extremely small, the off-current of the transistor of this embodiment in reverse bias can be reduced. It is preferable that the off-current be as low as possible. In the transistor of this embodiment, the off-current per micrometer of channel width can be made equal to or less than 10 aA/μm ($1\times10^{-17}$ A/μm), equal to or less than 1 aA/μm ($1\times10^{-18}$ A/μm), equal to or less than 10 zA/μm ($1\times10^{-20}$ A/μm), and further equal to or less than 1 zA/μm ($1\times10^{-21}$ A/μm).

The transistor of this embodiment has a relatively high field-effect mobility and is capable of high-speed driving. Therefore, when the transistor of this embodiment is used, for example, the voltage input to the semiconductor device can be controlled more quickly.

Note that this embodiment can be combined with or replaced by any of the other embodiments, as appropriate.

Embodiment 7

In this embodiment, an example of a plurality of transistors that can be applied to any of the semiconductor devices shown in the above embodiments will be described.

Figure 10A:
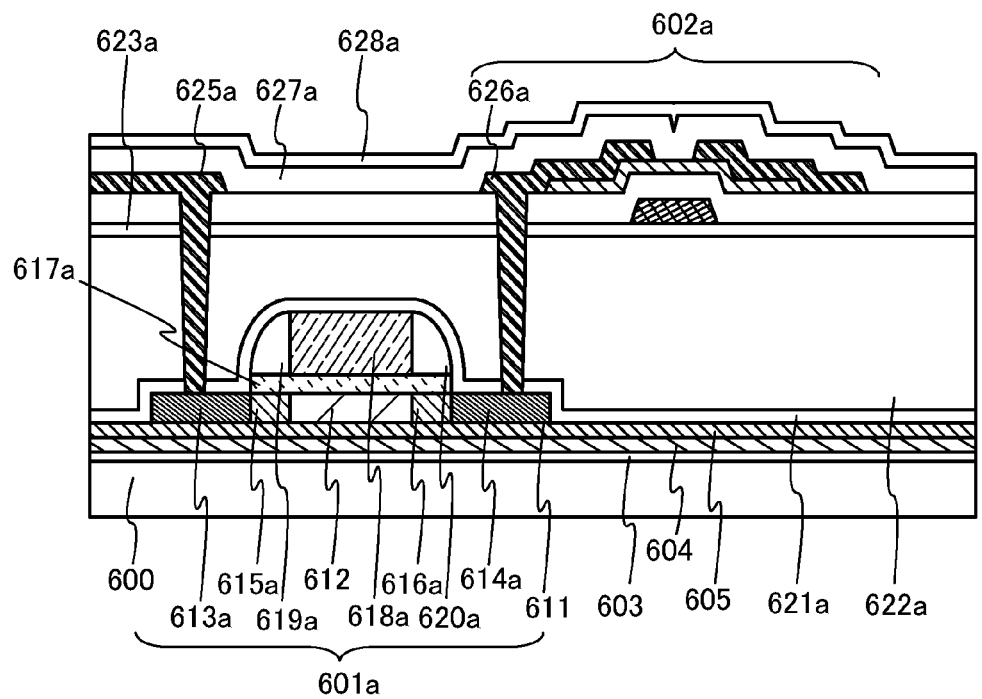
FIGS. 10A and 10B are cross-sectional schematic diagrams each illustrating an example of a structure of a plurality of transistors in Embodiment 7.
Figure 10B:
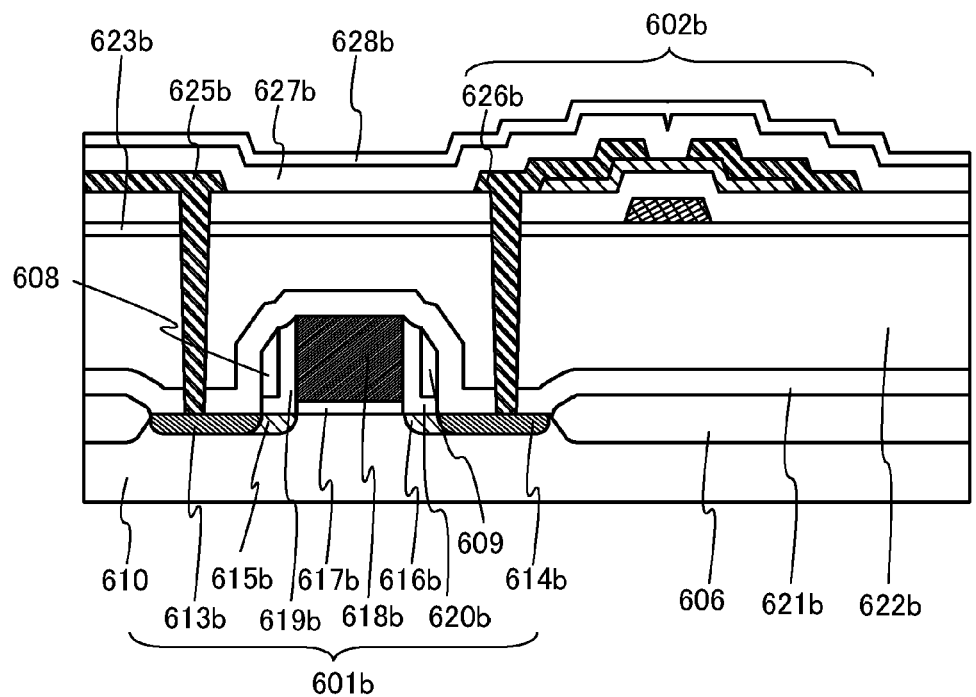

An example of a structure of a plurality of transistors in this embodiment which can be applied to any of the semiconductor devices shown in the above embodiments will be described with reference to FIGS. 10A and 10B. FIGS. 10A and 10B are cross-sectional schematic diagrams each illustrating an example of the structure of the plurality of transistors in this embodiment.

The structure illustrated in FIG. 10A includes a transistor 601a and a transistor 602a.

The transistor 601a is provided over a substrate 600 with an insulating layer 603, an insulating layer 604, and an insulating layer 605 interposed therebetween.

Further, the transistor 601a includes a semiconductor layer 611 serving as a channel formation layer, an insulating layer 617a serving as a gate insulating layer, a conductive layer 618a serving as a gate electrode, and an insulating layer 619a and an insulating layer 620a each serving as a sidewall insulating layer.

The semiconductor layer 611 is provided over the substrate 600 with the insulating layer 603, the insulating layer 604, and the insulating layer 605 interposed therebetween, the insulating layer 617a is provided over the semiconductor layer 611, the conductive layer 618a is provided over the semiconductor layer 611 with the insulating layer 617a interposed therebetween, and the insulating layer 619a and the insulating layer 620a are provided in contact with side surfaces of the conductive layer 618a.

Furthermore, the semiconductor layer 611 includes a channel formation region 612 under the conductive layer 618a, an impurity region 613a and an impurity region 614a serving as a source or drain region, a high-resistance impurity region 615a between the channel formation region 612 and the impurity region 613a, and a high-resistance impurity region 616a between the channel formation region 612 and the impurity region 614a.

The transistor 602a is provided over a top surface of the transistor 601a with an insulating layer 621a, an insulating layer 622a serving as a planarization layer, and an insulating layer 623a interposed therebetween. As the transistor 602a, for example, any of the transistors shown in the above Embodiment 6 can be used. As an example of the transistor 602a, FIG. 10A illustrates the transistor having the structure illustrated in FIG. 8A.

A conductive layer 626a serving as one of a source electrode and a drain electrode of the transistor 602a is in contact with the impurity region 614a through an opening formed in the insulating layer 621a, the insulating layer 622a, and the insulating layer 623a. Note that the conductive layer 626a may be in contact with the impurity region 614a via a plurality of conductive layers.

A conductive layer 625a which is formed on the same layer as the conductive layer 626a serving as one of the source electrode and the drain electrode of the transistor 602a is in contact with the impurity region 613a through an opening formed in the insulating layer 621a, the insulating layer 622a, and the insulating layer 623a. Note that the conductive layer 625a may be in contact with the impurity region 613a via a plurality of conductive layers.

Further, in the transistor 602a, an oxide insulating layer 627a is in contact with part of a top surface of an oxide semiconductor layer serving as a channel formation layer (part of the oxide semiconductor layer over which conductive layers serving as a source or drain electrode are not provided). A protective insulating layer 628a is provided over the oxide insulating layer 627a.

The structure illustrated in FIG. 10B includes a transistor 601b and a transistor 602b.

The transistor 601b includes a semiconductor substrate 610 having a channel formation region, an insulating layer 617b serving as a gate insulating layer, a conductive layer 618b serving as a gate electrode, and an insulating layer 619b, an insulating layer 620b, an insulating layer 608, and an insulating layer 609 serving as sidewall insulating layers.

The insulating layer 617b is provided over the semiconductor substrate 610, and the conductive layer 618b is provided over the semiconductor substrate 610 with the insulating layer 617b interposed therebetween.

Further, the semiconductor substrate 610 includes an insulating layer 606 serving as an isolation insulating layer with the other elements provided in the semiconductor substrate 610, an impurity region 613b and an impurity region 614b serving as a source or drain region, a high-resistance impurity region 615b between the channel formation region and the impurity region 613b, and a high-resistance impurity region 616b between the channel formation region and the impurity region 614b.

The transistor 602b is provided over a top surface of the transistor 601b with an insulating layer 621b, an insulating layer 622b, and an insulating layer 623b interposed therebetween. As the transistor 602b, for example, any of the transistors shown in the above Embodiment 6 can be used. As an example of the transistor 602b, FIG. 10B illustrates the transistor having the structure illustrated in FIG. 8A.

A conductive layer 626b serving as one of the source electrode and the drain electrode of the transistor 602b is in contact with the impurity region 614b through an opening formed in the insulating layer 621b, the insulating layer 622b, and the insulating layer 623b. Note that the conductive layer 626b may be in contact with the impurity region 614b via a plurality of conductive layers.

A conductive layer 625b which is provided on the same layer as the conductive layer 626b serving as one of the source electrode and the drain electrode of the transistor 602b is in contact with the impurity region 613b through an opening formed in the insulating layer 621b, the insulating layer 622b, and the insulating layer 623b. Note that the conductive layer 625b may be in contact with the impurity region 613b via a plurality of conductive layers.

Further, in the transistor 602b, an oxide insulating layer 627b is in contact with part of a top surface of an oxide semiconductor layer serving as a channel formation layer (part of the oxide semiconductor layer over which conductive layers serving as a source or drain electrode are not provided). A protective insulating layer 628b is provided over the oxide insulating layer 627b.

As the substrate 600, for example, a glass substrate, a ceramic substrate, a quartz substrate, a plastic substrate, or a silicon substrate can be used.

As the semiconductor substrate 610, for example, a silicon substrate, a germanium substrate, or a silicon germanium substrate can be used. The semiconductor substrate 610 may contain an impurity element imparting p-type conductivity.

As the insulating layer 603, the insulating layer 604, and the insulating layer 606, a silicon nitride layer, a silicon oxide layer, a silicon nitride oxide layer, a silicon oxynitride layer, an aluminum oxide layer, or an aluminum oxynitride layer can be used, for example.

As the insulating layer 605, it is possible to use, for example, a silicon oxide layer containing hydrogen, a silicon nitride layer containing hydrogen, a silicon nitride layer containing oxygen and hydrogen, a silicon oxynitride layer, or a silicon nitride oxide layer. For example, silicon oxide formed using organosilane is preferably used as silicon oxide containing hydrogen. This is because the silicon oxide film formed using organosilane can increase the bonding strength between the substrate 600 and the semiconductor layer 611. As organosilane, it is possible to use, for example, a silicon-containing compound such as tetraethoxysilane (TEOS, $Si(OC_2H_5)_4$), tetramethylsilane (TMS, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or tris(dimethylamino)silane ($SiH(N(CH_3)_2)_3$).

As the semiconductor layer 611, a layer containing one or both of silicon and germanium can be used, for example. Further, as the semiconductor layer 611, a single crystal semiconductor layer, a polycrystalline semiconductor layer, a microcrystalline semiconductor layer, or an amorphous semiconductor layer can be used.

For example, in the case where a single crystal semiconductor layer is used as the semiconductor layer 611, first, a single crystal semiconductor substrate is prepared and a damaged region is formed in the single crystal semiconductor substrate by, for example, ion irradiation. After the single crystal semiconductor substrate including the damaged region is bonded to the substrate 600 with the insulating layers 603 to 605 interposed therebetween, part of the single crystal semiconductor substrate is separated from the bonded substrate (the single crystal semiconductor substrate and the substrate 600) with the damaged region used as a cleavage surface. Then, the remaining single crystal semiconductor region on the substrate 600 is selectively removed by etching or the like, whereby the single crystal semiconductor layer can be formed.

The impurity region 613a, the impurity region 613b, the impurity region 614a, and the impurity region 614b are regions containing an impurity element which imparts n-type or p-type conductivity, and formed by, for example, addition of an impurity element which imparts n-type or p-type conductivity.

The high-resistance impurity region 615a, the high-resistance impurity region 615b, the high-resistance impurity region 616a, and the high-resistance impurity region 616b are regions having a higher resistance than the impurity region 613a, the impurity region 613b, the impurity region 614a, and the impurity region 614b, and are formed by, for example, addition of an impurity element imparting n-type or p-type conductivity at a lower concentration than that of the impurity region 613a, the impurity region 613b, the impurity region 614a, and the impurity region 614b.

As the insulating layers 617a and 617b, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layers 617a and 617b can also be formed by stacking layers of materials which can be applied to the insulating layers 617a and 617b. The layers of materials which can be applied to the insulating layers 617a and 617b can be formed by plasma CVD, sputtering, or the like. For example, the insulating layers 617a and 617b can be formed in such a manner that a silicon nitride layer is formed by plasma CVD and a silicon oxide layer is formed over the silicon nitride layer by plasma CVD.

As the conductive layers 618a and 618b, a layer of a metal material such as molybdenum, titanium, chromium, tantalum, tungsten, aluminum, copper, neodymium, or scandium, or an alloy material which contains any of the metal materials as a main component can be used. The conductive layers 618a and 618b can also be formed by stacking layers of materials which can be applied to the conductive layers 618a and 618b. For example, the conductive layers 618a and 618b can be formed in such a manner that a conductive film is formed by sputtering and then the conductive film is selectively etched.

As the insulating layer 619a, the insulating layer 619b, the insulating layer 608, and the insulating layer 609, a silicon nitride layer, a silicon oxide layer, a silicon nitride oxide layer, a silicon oxynitride layer, an aluminum oxide layer, or an aluminum oxynitride layer can be used, for example.

As the insulating layer 621a and the insulating layer 621b, a silicon nitride layer, a silicon oxide layer, a silicon nitride oxide layer, a silicon oxynitride layer, an aluminum oxide layer, or an aluminum oxynitride layer can be used, for example. The insulating layer 621a and the insulating layer 621b can also be formed by stacking layers of materials which can be applied to the insulating layer 621a and the insulating layer 621b. The insulating layer 621a and the insulating layer 621b are formed by plasma CVD or the like.

As the insulating layer 622a and the insulating layer 622b, an organic material layer or an inorganic material layer can be used, for example. The insulating layer 622a and the insulating layer 622b can also be formed by stacking layers of materials which can be applied to the insulating layer 622a and the insulating layer 622b. The insulating layer 622a and the insulating layer 622b are formed by plasma CVD or the like.

As the insulating layer 623a and the insulating layer 623b, a silicon nitride layer, a silicon oxide layer, a silicon nitride oxide layer, a silicon oxynitride layer, an aluminum oxide layer, or an aluminum oxynitride layer can be used, for example. The insulating layer 623a and the insulating layer 623b can also be formed by stacking layers of materials which can be applied to the insulating layer 623a and the insulating layer 623b. The insulating layer 623a and the insulating layer 623b are formed by plasma CVD or the like.

As the conductive layer 625a, the conductive layer 625b, the conductive layer 626a, and the conductive layer 626b, a layer of a material which can be applied to a conductive layer serving as the source or drain electrode of the transistor 602a and the transistor 602b can be used, for example. The conductive layer 625a, the conductive layer 625b, the conductive layer 626a, and the conductive layer 626b can also be formed by stacking layers of materials which can be applied to the conductive layer 625a, the conductive layer 625b, the conductive layer 626a, and the conductive layer 626b.

As illustrated in the example of FIGS. 10A and 10B, the semiconductor devices in the above embodiments can be formed by using a plurality of transistors having different structures. Consequently, a transistor with an optimal structure can be selectively used in accordance with the property of each circuit; for example, an n-channel transistor and a p-channel transistor can be selectively manufactured.

Note that this embodiment can be combined with or replaced by any of the other embodiments, as appropriate.

Embodiment 8

In this embodiment, description will be made on an electronic device including the semiconductor device which is shown in the above embodiments and is capable of generating a power supply voltage through wireless communication.

Examples of a configuration of the electronic device in this embodiment will be described with reference to FIGS. 11A to 11F. FIGS. 11A to 11F are views each illustrating an example of the configuration of the electronic device in this embodiment.

Figure 11A:
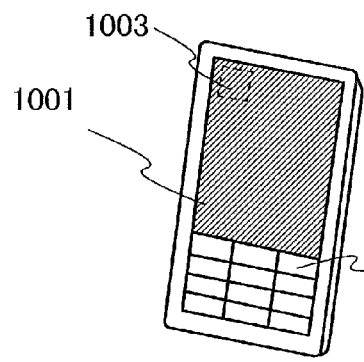
FIGS. 11A to 11F are views each illustrating an example of an electronic device in Embodiment 8.

The electronic device illustrated in FIG. 11A is a personal digital assistant. The personal digital assistant illustrated in FIG. 11A includes at least a display portion 1001 and a chip 1003. The personal digital assistant illustrated in FIG. 11A can be combined with a touch panel or the like, and can be used as an alternative to a variety of portable objects. For example, when the display portion 1001 is provided with an operation portion 1002 using a touch panel, the personal digital assistant can be used as a cellular phone. As the touch panel, for example, a resistive touch panel, an infrared touch panel, a capacitive touch panel, or an optical touch panel can be used. Note that the operation portion 1002 is not necessarily provided in the display portion 1001, and operation buttons may be provided separately in the personal digital assistant illustrated in FIG. 11A. Moreover, since the chip 1003 is provided, the personal digital assistant illustrated in FIG. 11A can generate a power supply voltage through wireless communication and operate with the generated power supply voltage. The personal digital assistant is sometimes used in the environment where power cannot be supplied externally; therefore, the semiconductor device of one embodiment of the present invention, which is capable of generating a power supply voltage through wireless communication, is preferably used for the personal digital assistant.

Figure 11D:
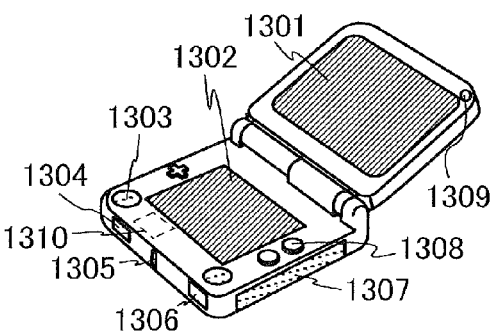
Figure 11B:
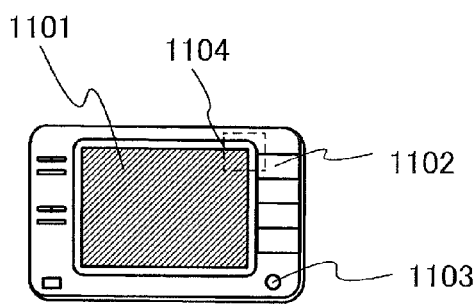

The electronic device illustrated in FIG. 11B is an information guide terminal including an automotive navigation system, for example. The information guide terminal illustrated in FIG. 11B includes at least a display portion 1101 and a chip 1104, and can also have operation buttons 1102, an external input terminal 1103, and the like. The in-car temperature changes greatly in accordance with the outside-air temperature, and sometimes exceeds 50° C. Since the characteristics of the semiconductor device shown in the above embodiments hardly change due to the temperature, the semiconductor device in the above embodiments is particularly effective under the circumstances where the temperature greatly changes, such as the inside of a car. Moreover, since the chip 1104 is provided, the information guide terminal illustrated in FIG. 11B can generate a power supply voltage through wireless communication and operate with the generated power supply voltage. The information guide terminal is sometimes used in the environment where power cannot be supplied externally; therefore, the semiconductor device of one embodiment of the present invention, which is capable of generating a power supply voltage through wireless communication, is preferably used for the information guide terminal.

Figure 11E:
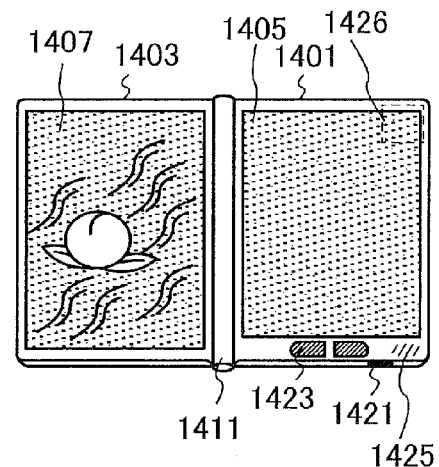
Figure 11C:
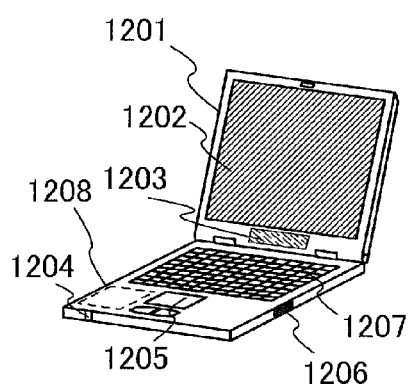

The electronic device illustrated in FIG. 11C is a laptop personal computer. The laptop personal computer illustrated in FIG. 11C includes a housing 1201, a display portion 1202, a speaker 1203, an LED lamp 1204, a pointing device 1205, a connection terminal 1206, a keyboard 1207, and a chip 1208. Since the chip 1208 is provided, the electronic device illustrated in FIG. 11C can generate a power supply voltage through wireless communication and operate with the generated power supply voltage. The laptop personal computer is sometimes used in the environment where power cannot be supplied externally; therefore, the semiconductor device of one embodiment of the present invention, which is capable of generating a power supply voltage through wireless communication, is preferably used for the laptop personal computer.

The electronic device illustrated in FIG. 11D is a portable game machine. The portable game machine illustrated in FIG. 11D includes a display portion 1301, a display portion 1302, a speaker 1303, a connection terminal 1304, an LED lamp 1305, a microphone 1306, a recording medium reading portion 1307, operation buttons 1308, a sensor 1309, and a chip 1310. Since the chip 1310 is provided, the portable game machine illustrated in FIG. 11D can generate a power supply voltage through wireless communication and operate with the generated power supply voltage. The portable game machine is sometimes used in the environment where power cannot be supplied externally; therefore, the semiconductor device of one embodiment of the present invention, which is capable of generating a power supply voltage through wireless communication, is preferably used for the portable game machine.

The electronic device illustrated in FIG. 11E is an e-book reader. The e-book reader illustrated in FIG. 11E includes at least a housing 1401, a housing 1403, a display portion 1405, a display portion 1407, a hinge 1411, and a chip 1426.

The housing 1401 and the housing 1403 are connected with the hinge 1411. The e-book reader illustrated in FIG. 11E can be opened and closed with the hinge 1411 as an axis.

With such a structure, the e-book reader can be handled like a paper book. The display portion 1405 is incorporated in the housing 1401 and the display portion 1407 is incorporated in the housing 1403. The display portion 1405 and the display portion 1407 may display different images. For example, one image can be displayed across both the display portions. With the structure where different images are displayed on the display portion 1405 and the display portion 1407, for example, text can be displayed on a display portion on the right side (the display portion 1405 in FIG. 11E) and graphics can be displayed on a display portion on the left side (the display portion 1407 in FIG. 11E).

In the e-book reader illustrated in FIG. 11E, an operation portion or the like can be provided in the housing 1401. For example, the e-book reader illustrated in FIG. 11E may include a power switch 1421, operation keys 1423, and a speaker 1425. In the case where an image with a plurality of pages is displayed in the e-book reader illustrated in FIG. 11E, the pages can be turned with the operation keys 1423. Furthermore, in the e-book reader illustrated in FIG. 11E, a keyboard or a pointing device may be provided in the display portion 1405 and the display portion 1407, or in the display portion 1405 or the display portion 1407. Also in the e-book reader illustrated in FIG. 11E, an external connection terminal (an earphone terminal, a USB terminal, a terminal connectable to a variety of cables such as an AC adapter and a USB cable, or the like), a recording medium insertion portion, and the like may be provided on the back surface or side surface of the housing 1401 and the housing 1403. In addition, the e-book reader illustrated in FIG. 11E may have a function of an electronic dictionary.

Since the chip 1426 is provided, the e-book reader illustrated in FIG. 11E can generate a power supply voltage through wireless communication and operate with the generated power supply voltage. The e-book reader is sometimes used in the environment where power cannot be supplied externally; therefore, the semiconductor device of one embodiment of the present invention, which is capable of generating a power supply voltage through wireless communication, is preferably used for the e-book reader.

The e-book reader illustrated in FIG. 11E can have a configuration capable of transmitting and receiving data through wireless communication. With such a configuration, desired book data or the like can be purchased and downloaded from an electronic book server.

Figure 11F:
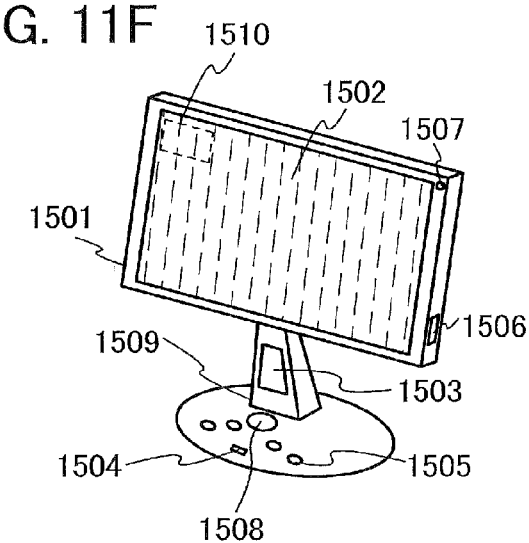

The electronic device illustrated in FIG. 11F is a display. The display illustrated in FIG. 11F includes a housing 1501, a display portion 1502, a speaker 1503, an LED lamp 1504, operation buttons 1505, a connection terminal 1506, a sensor 1507, a microphone 1508, a support base 1509, and a chip 1510. Since the chip 1510 is provided, the display illustrated in FIG. 11F can generate a power supply voltage through wireless communication and operate with the generated power supply voltage. When the semiconductor device of one embodiment of the present invention, which is capable of generating a power supply voltage through wireless communication, is used for the display, a power supply terminal or the like does not need to be provided, resulting in a reduction in the number of wirings and terminals.

Note that as the chip 1003, the chip 1104, the chip 1208, the chip 1310, the chip 1426, or the chip 1510, the semiconductor device shown in the above embodiments, which is capable of generating a power supply voltage through wireless communication, can be used.

As illustrated in the examples of FIGS. 11A to 11F, the electronic devices in this embodiment can generate a power supply voltage through wireless communication. With such a configuration, the electronic devices can be used for a certain period even in the environment where the electronic devices cannot be connected to a power feeding means.

Note that the electronic devices shown in this embodiment can have a power storage device in which a generated power supply voltage is stored. Consequently, the electronic devices can be used for a certain period even without an external power supply, resulting in an improvement in convenience. As the power storage device, for example, one or more of a lithium ion secondary battery, a lithium ion capacitor, an electric double-layer capacitor, and a redox capacitor can be used. For example, a lithium ion secondary battery and a lithium ion capacitor can be used together, whereby a power storage device which can charge or discharge at high speed and can supply electric power for a long time can be formed. Note that the power storage device is not limited to the lithium ion secondary battery. As the power storage device, a secondary battery in which another alkali metal ion, alkaline earth metal ion, or the like is used as a mobile ion may be used. Further, the power storage device is not limited to the lithium ion capacitor. As the power storage device, a capacitor in which another alkali metal ion, alkaline earth metal ion, or the like is used as a mobile ion may be used.

The application of the semiconductor device in the above embodiments is not limited to the electronic devices illustrated in FIGS. 11A to 11F, and for example, the semiconductor device can also be applied to an electric car.

Note that this embodiment can be combined with or replaced by any of the other embodiments, as appropriate.

Embodiment 9

In this embodiment description will be made on an information medium including the semiconductor device which is shown in the above embodiments and is capable of transmitting and receiving signals through wireless communication.

Examples of a configuration of the information medium in this embodiment will be described with reference to FIGS. 12A to 12D. FIGS. 12A to 12D are views each illustrating an example of the configuration of the information medium in this embodiment.

Figure 12A:
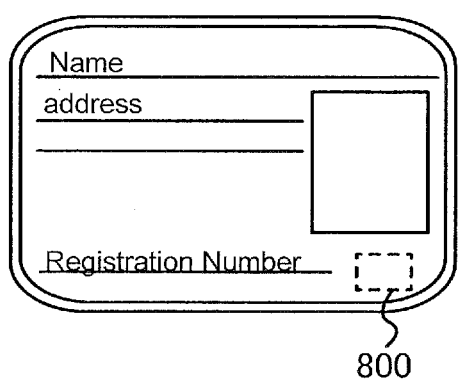
FIGS. 12A to 12D are views each illustrating an information medium in Embodiment 9.

The information medium illustrated in FIG. 12A is a card certificate recording personal data. The card certificate illustrated in FIG. 12A includes a chip 800, so that security function such as prevention of forgery can be improved. As the card certificate, for example, driver's licenses, resident cards, or passports can be given. With high reliability, the chip 800 is suitable for the card certificate and the like which are used for a long period.

Figure 12B:
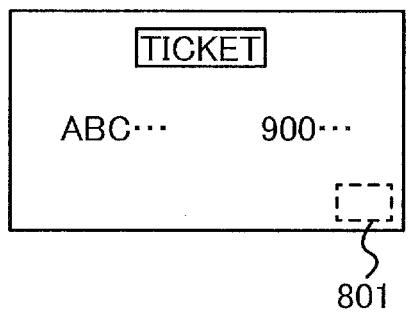

The information medium illustrated in FIG. 12B is a ticket information medium. The ticket information medium illustrated in FIG. 12B includes a chip 801, so that information other than that printed on the ticket information medium can be stored in the chip 801. In addition, the chip 801 can improve security function such as prevention of forgery of the ticket information medium illustrated in FIG. 12B. Since the chip 801 has high reliability, for example, a cutoff portion is provided in part of the ticket and only the chip 801 is cut along the cutoff portion when the ticket information medium is no longer used, whereby only the chip 801 can be collected and reused. As the ticket information medium, for example, paper money, railway tickets, securities, or other tickets can be given.

Figure 12C:
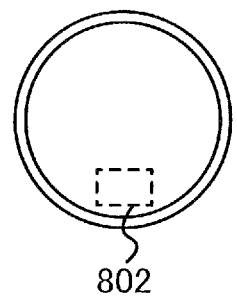

The information medium illustrated in FIG. 12C is a coin information medium. The coin information medium includes a chip 802, so that information other than that printed on the coin information medium can be stored in the chip 802. In addition, the chip 802 can improve security function such as prevention of forgery of the coin information medium illustrated in FIG. 12C. As the coin information medium, for example, coins, railway tickets, securities, or other tickets can be given.

Figure 12D:
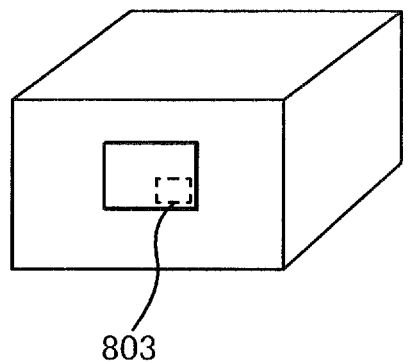

The information medium illustrated in FIG. 12D is an article. The article includes a chip 803, so that information other than that printed on the article can be stored in the chip 803. In addition, the chip 803 can improve security function such as prevention of forgery of the article illustrated in FIG. 12D. There is no particular limitation on the article, and for example, various articles such as electronic appliances and household commodities can be given.

As the chips 800 to 803, for example, the semiconductor device shown in the above embodiments, which is capable of wireless communication, can be employed.

As described above, the information medium in this embodiment includes a chip capable of wireless communication. With such a configuration, the specific data of the information medium including a chip can be read through wireless communication and utilized. As a result, the information medium can be managed more easily with higher security.

Note that this embodiment can be combined with or replaced by any of the other embodiments, as appropriate.

Example 1

In this example, an example of the semiconductor device shown in the above embodiments will be described.

Semiconductor devices shown in this example are a semiconductor device having the configuration illustrated in FIG. 5 (also referred to as a configuration A), and a semiconductor device having a configuration in which the transistor 533 and the resistor 534 illustrated in FIG. 5 are not provided and the node N55 is electrically connected to the gate of the transistor 536 (also referred to as a configuration B).

Figure 13A:
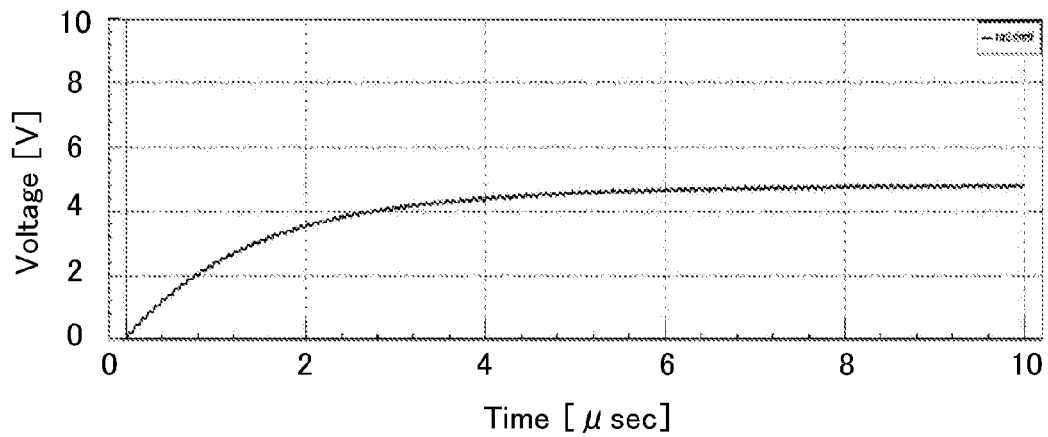
FIGS. 13A to 13C are graphs each illustrating the transient characteristics of a semiconductor device in Example 1.
Figure 13B:
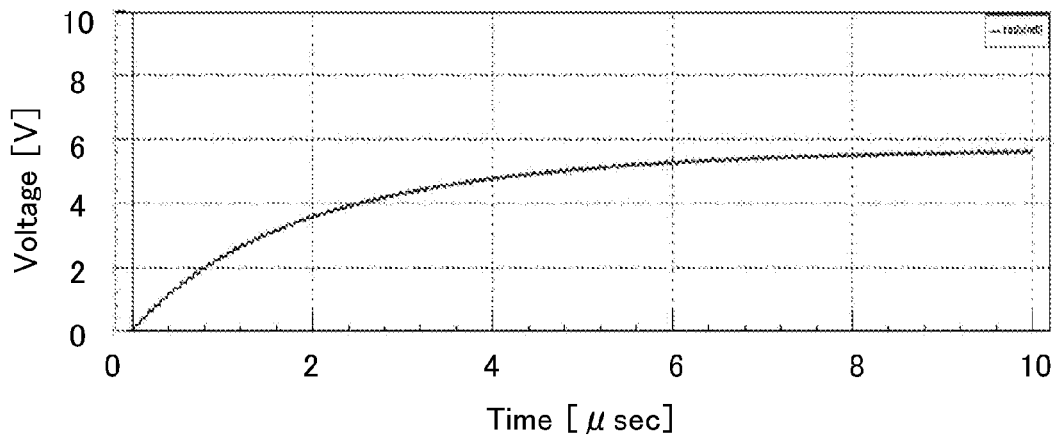
Figure 13C:
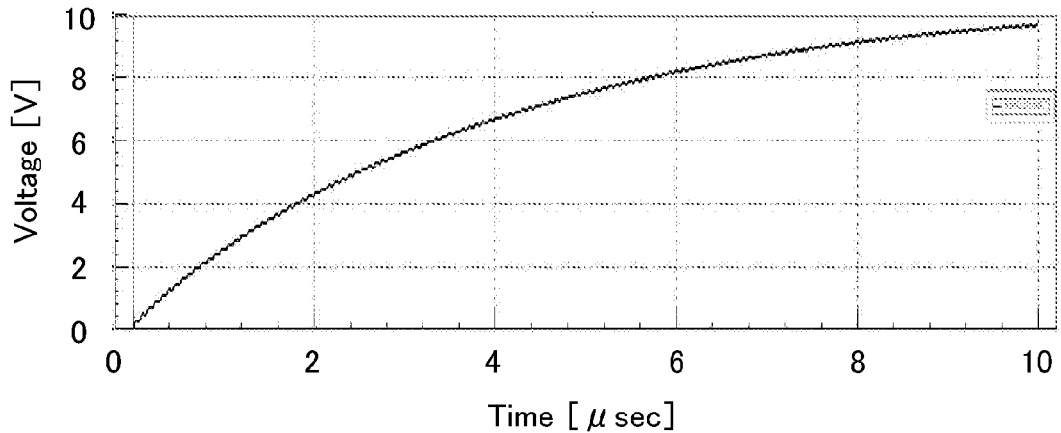

The operation of each semiconductor device was verified. The verification results are illustrated in FIGS. 13A to 13C. FIGS. 13A to 13C are graphs illustrating the transient characteristics of the semiconductor devices to which a predetermined voltage input. In FIGS. 13A to 13C, the horizontal axis represents the time when a predetermined voltage is input to the semiconductor devices, and the vertical axis represents the value of a voltage applied to the power supply voltage generation circuit 504. Note that the verification was performed here on the assumption that the input voltage was 10 V, the antenna circuit 501 was connected to an AC power source with a constant value, and the power supply voltage generation circuit 504 had a constant load. As a comparative example, the operation of a semiconductor device from which the protection circuit 503 illustrated in FIG. 5 is removed (also referred to as a configuration C) was verified.

FIG. 13A illustrates the transient characteristics of the semiconductor device with the configuration A, FIG. 13B illustrates the transient characteristics of the semiconductor device with the configuration B, and FIG. 13C illustrates the transient characteristics of the semiconductor device with the configuration C. The results show that in the semiconductor devices with the configurations A and B, an increase in the voltage applied to the power supply voltage generation circuit 504 is suppressed even when time passes, as compared to in the semiconductor device with the configuration C. Consequently, it is found that in the semiconductor devices shown in this example, the protection circuit prevents application of a high voltage to the power supply generation circuit.

This application is based on Japanese Patent Application serial no. 2010-019183 filed with Japan Patent Office on Jan. 29, 2010, the entire contents of which are hereby incorporated by reference.

The invention claimed is:

1. A semiconductor device comprising:
a rectifier circuit; and
a protection circuit comprising:
  a first transistor;
  a second transistor;
  a rectifier element;
  a first resistor; and
  a second resistor,
wherein an input terminal of the rectifier circuit is electrically connected to one of a source and a drain of the second transistor,
wherein an output terminal of the rectifier circuit is directly connected to one of a source and a drain of the first transistor and a first terminal of the second resistor,
wherein a second terminal of the second resistor is directly connected to a terminal of the rectifier element and a gate of the first transistor,
wherein the other of the source and the drain of the first transistor is electrically connected to a terminal of the first resistor and a gate of the second transistor,
wherein an insulating layer is provided over the first transistor, and
wherein the second transistor is provided over the insulating layer.

2. The semiconductor device according to claim 1,
wherein a semiconductor layer of the first transistor includes silicon, and
wherein a semiconductor layer of the second transistor includes an oxide semiconductor.

3. The semiconductor device according to claim 1, wherein a semiconductor layer of the second transistor comprises at least one of indium, gallium, tin, and zinc.

4. The semiconductor device according to claim 1, wherein a band gap of a semiconductor layer of the second transistor is equal to or more than 2 eV.

5. The semiconductor device according to claim 1, wherein a carrier concentration of a semiconductor layer of the second transistor is less than $1 \times 10^{14}/cm^3$.

6. The semiconductor device according to claim 1, wherein a semiconductor layer of the second transistor comprises a crystalline region including a c-axis aligned in a direction perpendicular to a surface of the semiconductor layer of the second transistor.

7. The semiconductor device according to claim 1, wherein the rectifier element is a diode-connected transistor.

8. The semiconductor device according to claim 7, wherein the diode-connected transistor includes an oxide semiconductor.

9. The semiconductor device according to claim 1, further comprising a capacitor,
wherein a first terminal of the capacitor is electrically connected to the one of the source and the drain of the second transistor, and
wherein a second terminal of the capacitor is electrically connected to the input terminal of the rectifier circuit.

10. The semiconductor device according to claim 1, wherein the rectifier element is a diode.

11. A semiconductor device comprising:
a rectifier circuit; and
a protection circuit comprising:
  a first circuit comprising:
    a first transistor;
    a rectifier element;
    a first resistor; and
    a second resistor; and
  a second circuit comprising:
    a second transistor,
wherein an input terminal of the rectifier circuit is electrically connected to the second circuit,
wherein an output terminal of the rectifier circuit is electrically connected to the first circuit,
wherein a terminal of the second resistor is directly connected to a terminal of the rectifier element and a gate of the first transistor,
wherein one of a source and a drain of the first transistor is electrically connected to a terminal of the first resistor and a gate of the second transistor,
wherein an insulating layer is provided over the first transistor, and
wherein the second transistor is provided over the insulating layer.

12. The semiconductor device according to claim 11,
wherein a semiconductor layer of the first transistor includes silicon, and
wherein a semiconductor layer of the second transistor includes an oxide semiconductor.

13. The semiconductor device according to claim 11, wherein a semiconductor layer of the second transistor comprises at least one of indium, gallium, tin, and zinc.

14. The semiconductor device according to claim 11, wherein a band gap of a semiconductor layer of the second transistor is equal to or more than 2 eV.

15. The semiconductor device according to claim 11, wherein a carrier concentration of a semiconductor layer of the second transistor is less than $1 \times 10^{14}/cm^3$.

16. The semiconductor device according to claim 11, wherein a semiconductor layer of the second transistor comprises a crystalline region including a c-axis aligned in a direction perpendicular to a surface of the semiconductor layer of the second transistor.

17. The semiconductor device according to claim 11, wherein the rectifier element is a diode-connected transistor.

18. The semiconductor device according to claim 17, wherein the diode-connected transistor includes an oxide semiconductor.

19. The semiconductor device according to claim 11, wherein the second circuit comprises a capacitor, a terminal of the capacitor is electrically connected to one of a source and a drain of the second transistor.

20. The semiconductor device according to claim 11, wherein the rectifier element is a diode.

21. A semiconductor device comprising:
an antenna;
a rectifier circuit electrically connected to the antenna; and
a protection circuit comprising:
  a first transistor;
  a second transistor;
  a rectifier element;
  a first resistor; and
  a second resistor,
wherein an input terminal of the rectifier circuit is electrically connected to one of a source and a drain of the second transistor, wherein an output terminal of the rectifier circuit is directly connected to one of a source and a drain of the first transistor and a first terminal of the second resistor, wherein a second terminal of the second resistor is directly connected to a terminal of the rectifier element and a gate of the first transistor, wherein the other of the source and the drain of the first transistor is electrically connected to a terminal of the first resistor and a gate of the second transistor, wherein an insulating layer is provided over the first transistor, and wherein the second transistor is provided over the insulating layer.

22. The semiconductor device according to claim 21, wherein a semiconductor layer of the first transistor includes silicon, and wherein a semiconductor layer of the second transistor includes an oxide semiconductor.

23. The semiconductor device according to claim 21, wherein a semiconductor layer of the second transistor comprises at least one of indium, gallium, tin, and zinc.

24. The semiconductor device according to claim 21, wherein a band gap of a semiconductor layer of the second transistor is equal to or more than 2 eV.

25. The semiconductor device according to claim 21, wherein a carrier concentration of a semiconductor layer of the second transistor is less than $1 \times 10^{14}/cm^3$.

26. The semiconductor device according to claim 21, wherein a semiconductor layer of the second transistor comprises a crystalline region including a c-axis aligned in a direction perpendicular to a surface of the semiconductor layer of the second transistor.

27. The semiconductor device according to claim 21, wherein the rectifier element is a diode-connected transistor.

28. The semiconductor device according to claim 27, wherein the diode-connected transistor includes an oxide semiconductor.

29. The semiconductor device according to claim 21, further comprising a capacitor, wherein a first terminal of the capacitor is electrically connected to the one of the source and the drain of the second transistor, and wherein a second terminal of the capacitor is electrically connected to the input terminal of the rectifier circuit.

30. The semiconductor device according to claim 21, wherein the rectifier element is a diode.

31. A semiconductor device comprising:
an antenna;
a rectifier circuit electrically connected to the antenna; and
a protection circuit comprising:
 a first circuit comprising:
  a first transistor;
  a rectifier element;
  a first resistor; and
  a second resistor; and
 a second circuit comprising:
  a second transistor, wherein an input terminal of the rectifier circuit is electrically connected to the second circuit, wherein an output terminal of the rectifier circuit is electrically connected to the first circuit, wherein a terminal of the second resistor is directly connected to a terminal of the rectifier element and a gate of the first transistor, wherein one of a source and a drain of the first transistor is electrically connected to a terminal of the first resistor and a gate of the second transistor, wherein an insulating layer is provided over the first transistor, and wherein the second transistor is provided over the insulating layer.

32. The semiconductor device according to claim 31, wherein a semiconductor layer of the first transistor includes silicon, and wherein a semiconductor layer of the second transistor includes an oxide semiconductor.

33. The semiconductor device according to claim 31, wherein a semiconductor layer of the second transistor comprises at least one of indium, gallium, tin, and zinc.

34. The semiconductor device according to claim 31, wherein a band gap of a semiconductor layer of the second transistor is equal to or more than 2 eV.

35. The semiconductor device according to claim 31, wherein a carrier concentration of a semiconductor layer of the second transistor is less than $1 \times 10^{14}/cm^3$.

36. The semiconductor device according to claim 31, wherein a semiconductor layer of the second transistor comprises a crystalline region including a c-axis aligned in a direction perpendicular to a surface of the semiconductor layer of the second transistor.

37. The semiconductor device according to claim 31, wherein the rectifier element is a diode-connected transistor.

38. The semiconductor device according to claim 37, wherein the diode-connected transistor includes an oxide semiconductor.

39. The semiconductor device according to claim 31, wherein the second circuit comprises a capacitor, a terminal of the capacitor is electrically connected to one of a source and a drain of the second transistor.

40. The semiconductor device according to claim 31, wherein the rectifier element is a diode.

* * * * *